United States Patent [19]

Tani et al.

[11] Patent Number: 5,547,921
[45] Date of Patent: Aug. 20, 1996

[54] RARE EARTH SUPERCONDUCTING COMPOSITION AND PROCESS FOR PRODUCTION THEREOF

[75] Inventors: Makoto Tani, Inazawa; Tooru Hayase, Nagoya; Hideki Shimizu, Nagoya; Kazuyuki Matsuda, Nagoya, all of Japan

[73] Assignee: NGK Insulators, Ltd., Japan

[21] Appl. No.: 375,277

[22] Filed: Jan. 19, 1995

Related U.S. Application Data

[63] Continuation of Ser. No. 37,005, Mar. 25, 1993, abandoned.

[30] Foreign Application Priority Data

Mar. 31, 1992 [JP] Japan .................................. 4-076552
Mar. 31, 1992 [JP] Japan .................................. 4-076865

[51] Int. Cl.⁶ .................. C04B 35/505; C04B 35/622; C04B 35/653
[52] U.S. Cl. .................. 505/124; 505/234; 505/236; 505/238; 505/450; 505/781; 505/785; 505/919; 252/521; 428/114; 428/212
[58] Field of Search .................. 252/518, 521, 252/514; 505/124, 234, 236, 238, 450, 470, 781, 785, 918, 919, 920; 428/114, 212

[56] References Cited

U.S. PATENT DOCUMENTS

| | | | |
|---|---|---|---|
| 4,990,493 | 2/1991 | Lay | 505/1 |
| 5,041,416 | 8/1991 | Wilson | 505/785 |
| 5,082,826 | 1/1992 | Ferrando | 505/785 |
| 5,089,468 | 2/1992 | Yoshida | 505/1 |
| 5,171,734 | 12/1992 | Sanjurjo | 505/1 |

FOREIGN PATENT DOCUMENTS

| | | |
|---|---|---|
| 0292126 | 11/1988 | European Pat. Off. . |
| 0426164 | 5/1991 | European Pat. Off. . |
| 4-224111 | 8/1992 | Japan . |

OTHER PUBLICATIONS

Jin et al "High $T_c$ superconductors—composite wire fabrication" Appl. Phys. Lett. 51(3) 20 Jul. 1987 pp. 203–204.
Physica C, vol. 4, 1 Dec. 1991, Amsterdam, NL pp. 2409–2410 Yoshida M. et al. 'Effects of the platinum group element addition on preparation of YBCO superconductor by melt growth method'.
Japanese Journal of Applied Physics, vol. 29, No. 11, 1990 L1991–L1994 (Nov. 1990).
ISTEC Journal, vol. 4, No. 3, 1991.
Singh "Mechanical and Superconducting Properties of Sintered . . . " Appl. Phys. Lett. v. 53(3) Jul. 18, 1988 pp. 237–239.
Politis "Is the magnetic suspension of high–temperature . . . " Modern Phys. Lett B v. 2(9) Oct. 1988 pp. 1119–1123.
Cheung "Superconductor—substrate interactions of the Y–Ba–Cu–oxide" J. Mater Res v. 4(1) Jan./Feb. 1989 p. 1–15.

*Primary Examiner*—Paul Lieberman
*Assistant Examiner*—M. Kopec
*Attorney, Agent, or Firm*—Parkhurst, Wendel & Burr

[57] ABSTRACT

A superconducting film including 0.1–5% by weight of magnesium oxide wherein the superconducting film has a thickness in a range from 300 to 1000 μm. A superconducting device for magnetic shielding comprises: a substrate; and a superconducting layer supported by the substrate, the superconducting layer including grains of a Bi-type superconducting oxide so that the superconducting layer has a critical temperature higher than −196° C., the superconducting layer having a thickness in a range from 300 to 1,000 μm, the superconducting layer including 0.1–5% by weight of magnesium oxide, where the superconducting device has a laminated structure including the substrate and the superconducting layer. A process for producing a superconducting film comprises the steps of: firing a mixture of calcined powders of a superconducting oxide and 0.1–5% by weight of magnesium oxide powders at a temperature at which the superconducting oxide is partially melted.

42 Claims, 8 Drawing Sheets

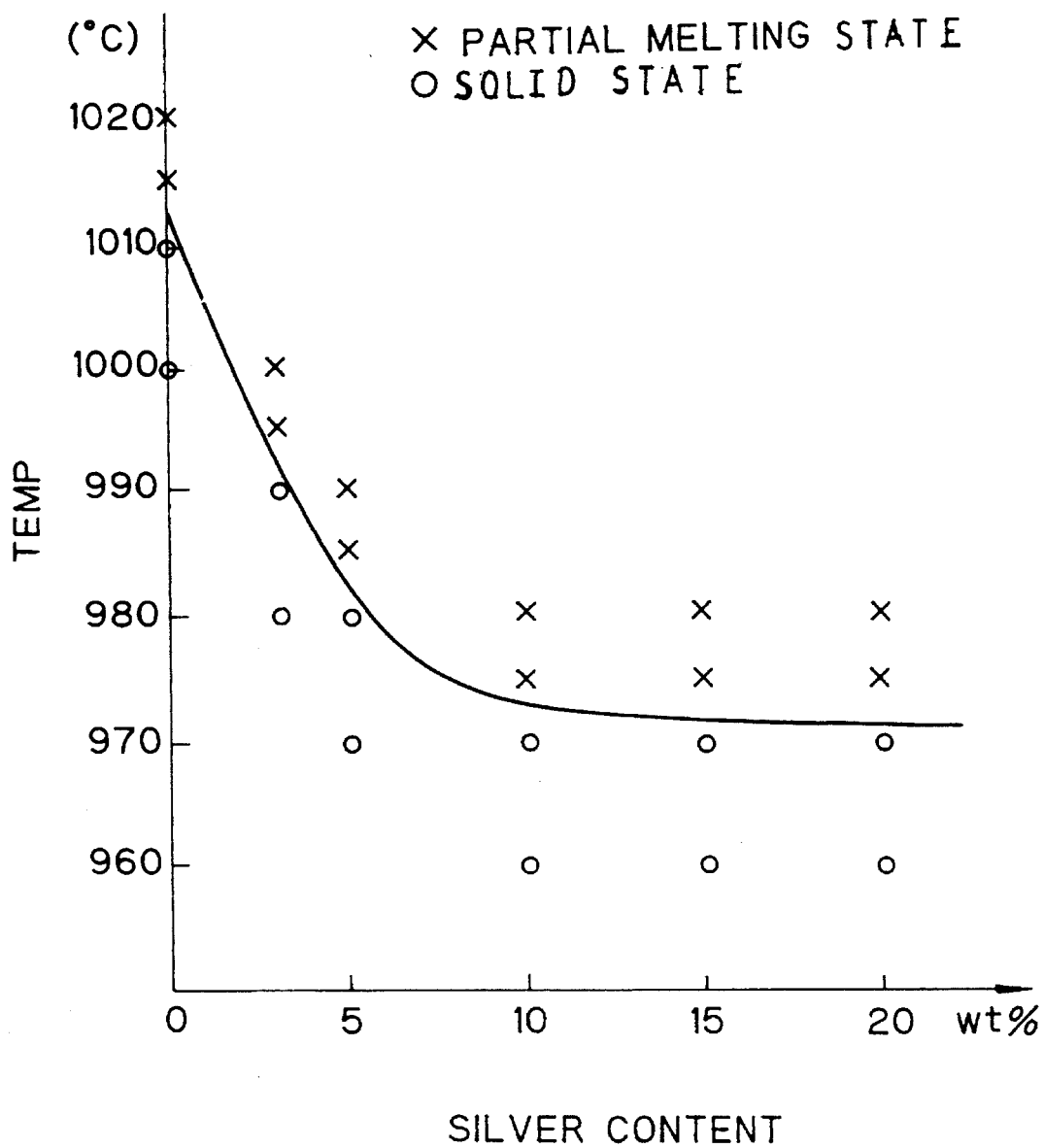

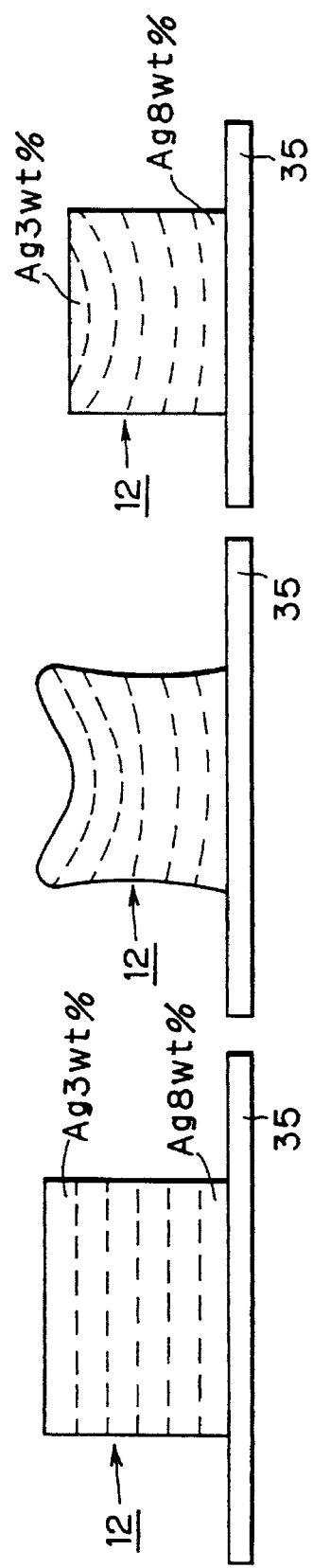

RARE EARTH SUPERCONDUCTING COMPOSITION AND PROCESS FOR PRODUCTION THEREOF

This is a Continuation of application Ser. No. 08/037,005 filed Mar. 25, 1993, now abandoned.

The present invention relates to a rare earth superconducting composition and a process for making the same. More particularly, the present invention relates to a rare earth superconducting composition whose grains have controlled orientation, as well as to a process for making the same.

Oxide superconductors belonging to the type II superconductor do not show phase transition from a superconducting phase to a normal conduction phase until they reach the second critical magnetic field even though the penetration of magnetic flux begins in the first critical field. Oxide superconductors differ from the type I superconductor wherein the penetration of magnetic flux begins at the critical magnetic field so that the phase undergoes a transition to normal conduction. Further, oxide superconductors have far higher critical temperatures than other superconductive materials such as alloys (e.g. Nb-Ti) and intermetallic compounds (e.g. $Nb_3Sn$). Hence, active researches are under way on oxide superconductors in order to improve their critical magnetic fields and critical current density for practical application.

Superconductivity is drawing attention because superconductors having superconductivity show complete diamagnetism, i.e. the Meissner effect. The Meissner effect is the most fundamental property possessed by superconductors; that is, any superconductor shows complete diamagnetism when an external magnetic field not larger than the critical magnetic field (the second critical magnetic field in the case of a type II superconductor) is applied thereto, because a supercurrent flows through the surface of the superconductor so as to cancel the external magnetic field and the magnetic flux are unable to enter the inside of the superconductor. Attempts have been made to apply a superconductor of diamagnetism, i.e. the Meissner effect to the development of material for magnetic shielding or material for magnetic levitation. Needless to say, the superconductor to be used in such a material is desired to have a supercurrent as large as possible.

Type II superconductors have a property that they show no phase transfer to normal conduction until they reach respective second critical magnetic fields although the penetration of magnetic flux begins at the first critical magnetic fields. Hence, type II superconductors can have higher supercurrents by having a large number of pinning centers to preventing magnetic flux penetrating the superconductor from moving by a Lorenz force even when the penetration of magnetic flux begins in a magnetic field equal to or larger than the first critical magnetic fields. It is known that lattice defects act as pinning centers.

Recently, it has been actively studied to obtain a superconductor of improved superconductivity by dispersing fine particles acting as pinning centers in an oxide superconductor. For example, Ogawa, Yoshida and Hirabayashi reported in ISTEC Journal, Vol. 4, No. 3, 1991, p. 30, a process in which a platinum group element is added in a compact as a variation of a melting process. The process comprises heating a mixture of calcined powders of $YBa_2Cu_3O_{7-x}$ and platinum powders to 1,110° C. to temperatures higher than an incongruent temperature of $YBa_2Cu_3O_{7-x}$ to put them in a semi-molten state where a solid phase of $Y_2BaCuO_5$ and a liquid phase coexist, and slowing cooling the mixture to obtain a rare earth-based oxide superconductor containing platinum. According to the reference, fine particles of unreacted $Y_2BaCuO_5$ are dispersed in grains of $YBa_2Cu_3O_{7-x}$ and act as pinning centers, whereby the oxide superconductor shows a high critical current density even in a magnetic field.

Also, the present applicant proposed in Japanese Patent Application No. 412529/1990 a rare earth-based oxide superconductor and a process for production thereof. The superconductor is obtained by adding a small amount of platinum or rhodium to disperse fine particles of $RE_2BaCuO_5$ (RE is Y, Gd, Dy, Ho, Er or Yb) in grains of $REBa_2Cu_3O_{7-x}$ and the fine particles act as pinning centers in the superconductor. Incidentally, when the volume percentage of a material acting as pinning centers is given, the material is desirably dispersed as finely and uniformly as possible.

In producing a rare earth-based oxide superconductor by a melting process, there has hitherto been used a so-called temperature gradation process wherein solidification is allowed to proceed in one direction to obtain large grains of high orientation. In this temperature gradation process, a compact of rare earth-based oxide superconductor having uniform quality is molded, then melted, and cooled slowly. During the slow cooling step the compact is subject to a temperature gradation of one direction to the superconductor and keeping the temperature gradation as each portion of the compact is cooled. Since the above superconductor as starting material is uniform and thus it has the same solidification point at any portion, crystallization starts from the lowest temperature portion and proceeds to higher temperature portions during the slow cooling step.

Alternatively, in S. Morita; S. Takebayashi; M. Tanaka; K. Kimura; K. Miyamoto; K. Sawano in "Advances in Superconductivity III; Proceedings of the 3rd International Symposium on Superconductivity (ISS '90)" K. Kajimura; H. Hayakawa (Eds.), Spring-Verlag: Tokyo; 1991, pp. 733–736, a substitution process as a variation of melting process is reported to obtain a rare earth-based oxide superconductor of high orientation. This substitution process comprises preparing masses of rare earth-based superconducting oxides, each mass containing a different rare earth element and having a different melting point; laminating the masses in layers in such a way that their melting points change gradually to form a laminate, heating the laminate in a semi-molten state and slowly cooling the laminate. For example, a rare earth-based oxide superconductor of high orientation and high crystallinity is obtained by subjecting a laminate of a $HoBa_2CuO_{7-x}$ (melting point: 990° C.) layer, a $YBa_2Cu_3O_{7-x}$ (melting point: 1,000° C.) layer and a $DyBa_2Cu_3O_{7-x}$ (melting point: 1,010° C.) layer to sintering and slow cooling to give rise to crystallization.

Also, a rare earth-based oxide superconductor of high crystal orientation is obtained by the above substitution process, using a laminate of 11 rare earth-based oxide superconductor layers all represented by $Y_yYb_{1-y}Ba_2Cu_3O_{7-x}$, in which layers y ranges from 0 to 1 at intervals of 0.1 and their melting points show a monotonous decrease.

A so-called seed crystal process using a seed crystal is known, which is a variation of a melting process. In this seed crystal process, firstly a compact of a rare earth-based oxide superconductor is contacted with a seed crystal. The seed crystal is a rare earth-based oxide superconductor which has the same constitution as the compact except that the rare earth element in the seed crystal is different from the rare earth element of the compact so that the seed crystal has a higher partial melting point than the compact. Then both the compact and the seed crystal are heated to a temperature between the partial melting points of the compact and seed crystal to put only the compact having a lower partial melting point into a semi-molten state. Finally the compact and the seed crystal are slowly cooled to give rise to crystallization starting from the portion of the compact contacting with the seed crystal. The process gives a rare earth-based oxide superconductor of high crystal orientation [S. Morita; S. Takebayashi; M. Tanaka; K. Kimura; K. Miyamoto; K. Sawano in "Advances in Superconductivity III; Proceedings of the 3rd International Symposium on Superconductivity (ISS '90)" K. Kajimura; H. Hayakawa (Eds.), Spring-Verlag: Tokyo; 1991, pp. 733–736].

In Japanese Patent Application No. 35028/1992, the present applicant proposed a seed crystal process using a seed crystal essentially consisting of $SrTiO_3$, $MgO$, $LaAlO_3$, $LaGaO_3$, $NdGaO_3$, $PrGaO_3$ or the like because their lattice constants are similar to that of $REBa_2Cu_3O_{7-x}$. Moreover, each of these compounds for a seed crystal has a melting point of at least 1,500° C., and the melting point is far higher than the partially melting points of rare earth-based oxide superconductors. Thus, the temperature employed for the melting step has a large freedom and can be selected from a wide range.

Any of the above-mentioned three melting processes for obtaining a rare earth-based oxide superconductor of high orientation has unresolved problems. First in the temperature gradation process, a special heating apparatus is needed. Moreover, since slow cooling is made while keeping a temperature gradation of a compact, special temperature control of high technique is required. These are not preferable from an industrial standpoint. Moreover, because of said special temperature control, the shape of the rare earth-based oxide superconductor produced is restricted to a simple shape.

In the substitution process using various rare earth-based oxide superconductors of different rare earth elements or of the same rare earth element of different amounts, there is utilized a phenomenon that these rare earth-based oxide superconductors have different partially melting points. Hence, the combinations of the rare earth elements usable together are restricted. Further, various powders containing two rare earth elements in various proportions must be prepared for production of a compact, requiring an additional step.

In the seed crystal process, the seed crystal becomes a starting point of crystallization and controls crystal orientation only at the initial stage of crystallization. Hence, crystal growth tends to occur at random not only from the area of a rare earth-based oxide superconductor which is in contact with the seed crystal, but also from portions of the superconductor which are not in contact with the seed crystal. Thus, it has been difficult to allow crystal growth to occur only from the area of the superconductor which is in contact with the seed crystal and thereby obtain a large oxide superconductor of good orientation.

SUMMARY OF THE INVENTION

According to a first aspect of the invention, there is provided a rare earth superconducting composition comprising; grains of a rare earth superconducting oxide; and a noble metal distributed in controlled concentrations in the rare earth superconducting composition.

The noble metal may be silver. Preferably the rare earth superconducting oxide is $REBa_2Cu_3O_{7-x}$ where RE is at least one element selected from the group consisting of Y, Gd, Dy, Ho, Er and Yb, wherein x ranges from 0 to 1. Concentrations of the noble metal monotonously may increase in a direction in the rare earth superconducting composition. Preferably the noble metal is present in a plurality of particles, the particles dispersed in each of the grains, some of the particles having diameters up to 5 μm.

According to a second aspect of the invention, there is provided a process for making a rare earth superconducting composition including grains of a rare earth superconducting oxide and a noble metal distributed in controlled concentrations in the rare earth superconducting composition, which comprises the steps of: (1) preparing a compact containing a rare earth superconducting oxide and a compound containing a noble metal wherein the noble metal is distributed in controlled concentrations in the compact; (2) heating the compact so that the compact becomes semi-molten in state; and (3) slowly cooling the compact so that grains of a rare earth superconducting oxide start growing from a portion of the compact in which a concentration of the noble metal is lowest.

Concentrations of the compound may monotonously increase in a direction in the compact. Preferably the compound is at least one element selected from a group consisting of metallic silver and silver oxide.

According to a third aspect of the invention, there is provided a process for making a rare earth superconducting composition, which comprises the steps of: (1) contacting a surface of a seed crystal with a surface of a compact containing a rare earth superconducting oxide and a compound containing a noble metal, the seed crystal having a partial melting point higher than a partial melting point of the compact, the seed crystal having a lattice constant similar to a lattice constant of the rare earth superconducting oxide; (2) heating the compact and the seed crystal so that the compact becomes semi-molten in state while the seed crystal remains intact; and (3) slowly cooling the compact and the seed crystal so that grains of the rare earth superconducting oxide start growing in the compact from the compact surface contacted with the seed crystal.

Preferably the compound is distributed in controlled concentrations in the compact so that the compact surface contacted with the seed crystal has a lowest concentration of the compound in the compact, and the concentration of the compound in the compact may increase as a distance from the surface increases.

An object of the first, second, and third aspect of the present invention is that grains of a rare earth superconducting composition have highly uniform orientation.

According to a fourth aspect of the invention, there is provided a rare earth superconducting composition comprising; grains of a rare earth superconducting oxide; and a plurality of particles dispersed in each of the grains, the particles including silver, some of the particles having diameters up to 5 μm.

The particles in the periphery of the grains may have diameters smaller than diameters of the particles in the center of the grains. An amount of the silver may range from 5 to 12% by weight of the rare earth superconducting composition. Preferably the rare earth superconducting oxide is $REBa_2Cu_3O_{7-x}$ where RE is at least one element selected from the group consisting of Y, Gd, Dy, Ho, Er and Yb and x ranges from 0 to 1. Preferably the particles in the periphery of the grains have a volume percentage larger than a volume percentage of the particles in the center of the grains.

According to a fifth aspect of the invention, there is provided a process for making a rare earth superconducting composition including grains of a rare earth superconducting oxide; and a plurality of particles dispersed in each of the grains, the particles including silver, some of the particles having diameters up to 5 μm, which comprises the steps of: (1) preparing a compact containing a rare earth superconducting oxide and a compound including silver, an amount of the compound ranging from about 5 to 12% by weight of the sum of the compound and the rare earth superconducting oxide; (2) heating the compact so that the compact becomes semi-molten in state; (3) rapidly cooling the compact to a freezing point of the compact at a cooling rate of at least 100° C. per hour; and (4) slowly cooling the compact so that grains of the rare earth superconducting oxide grow.

An object of the fourth and fifth aspect of the present invention is that grains of a rare earth superconducting composition are resilient to formation of cracks.

BRIEF DESCRIPTION OF THE DRAWING

FIG. 1 is a graph showing a relation between silver content in $YBa_2Cu_3O_{7-x}$ and freezing point of the composition essentially consisting of $YBa_2Cu_3O_{7-x}$ and silver.

FIGS. 3a, 3b, and 3c show cross sections explaining the vacuum melting step applicable to a compact of the rare earth superconducting composition of the present invention. FIG. 3a is before the vacuum melting, FIG. 3b is after the vacuum melting, and FIG. 3c is after polishing the compact subsequent to the vacuum melting step.

DETAILED DESCRIPTION OF THE INVENTION

Figure 2A:
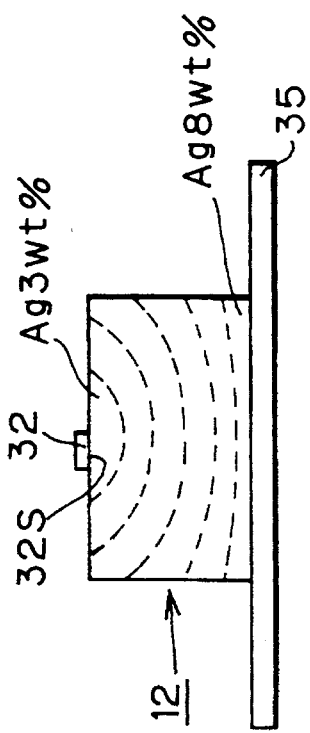
FIGS. 2a–2h show cross sections of compacts of rare earth superconducting compositions before firing, and in each compact a compound containing a noble metal is distributed in controlled concentrations.

In the noble metal gradation process of the present invention, a compact containing a rare earth superconducting oxide and a compound containing a noble metal is prepared, and the noble metal is distributed in controlled concentrations in the compact. The presence of a noble metal compound allows the compact of the rare earth superconducting composition to have a decreased freezing point, and the degree of freezing point decrease is in direct proportion, in a first-order approximation, to the content of the noble metal compound in a certain range of said content. For example, in FIG. 1, in a silver content range up to 5% by weight, the freezing point of $YBa_2Cu_3O_{7-x}$ decreases from about 1,010° C. to about 980° C. approximately in a direct proportion to the silver content; when the silver content reaches 10% or 12% by weight, the freezing point decreases to about 970° C. and levels off thereafter. Therefore, in the present invention, the maximum content of noble metal or noble metal compound in rare earth superconducting composition is preferably a point at which the freezing point of rare earth superconducting composition begins to level off.

In the present specification a noble metal compound refers to a compound containing a noble metal, and thus the noble metal compound includes noble metal itself, such as silver. Preferably the compound containing a noble metal is metallic silver and silver oxide.

In the noble metal gradation process of the present invention, the distribution of noble metal concentration in the compact of rare earth superconducting composition is controlled, whereby the distribution of freezing point in the compact is controlled. This rare earth superconducting composition compact having a controlled distribution of freezing point is heated to a temperature higher than a partial melting point of the compact so as to put the compact into a semi-molten state and then slowly cooled. During the slow cooing step crystallization occurs first at the portion of the compact having the highest freezing point and proceeds to a direction of lower freezing point. The distribution of noble metal concentration in the compact is such that this crystallization smoothly proceeds from the portion of the compact having the highest freezing point to a direction of the portions of the compact having lower freezing points. In this way a rare earth superconducting composition of high orientation is obtained.

In the seed crystal process of the present invention, a property of rare earth superconducting composition is utilized in which a rare earth superconducting composition gives a decreased freezing point thus the partially melting point of the compact is lower than the melting point of the seed crystal. Thus, the crystal and the compact can be heated to a temperature between the partial melting points of the compact and the seed crystal to put only the compact in a semi-molten state. In the present process, a compact containing a rare earth superconducting oxide and a noble metal compound is arranged in contact with a seed crystal which is a single crystal of a rare earth superconducting composition having a higher melting point than said compact; the crystal and the compact are heated to a temperature between the melting points of the compact and the seed crystal to put only the compact in a semi-molten state; then, the compact is slowly cooled to give rise to crystallization starting from the portion of the compact contacting with the seed crystal; thereby, a rare earth superconducting composition of high crystal orientation is obtained.

The seed crystal used in the present seed crystal process preferably has the same constitution as the constitution of the compact except that the seed crystal does not contain the noble metal compound. However, a constitution of the seed crystal is not restricted to that. When the seed crystal contains the rare earth superconducting oxide included in the compact, the seed crystal may also contain a noble metal compound as long as the content of the noble metal compound in the seed crystal is smaller than the content of the noble metal compound in the compact. Alternatively the seed crystal consisting of a rare earth superconducting oxide different from the rare earth superconducting oxide of the compact may be used, as long as the seed crystal has a higher partial melting point than that of the compact.

In the present seed crystal process, the compact of a rare earth superconducting composition containing a noble metal compound may have a uniform constitution, but the noble metal compound contained in the compact may have a controlled concentration distribution because it makes easier the production of a rare earth superconducting composition of high crystal orientation. In the latter case, the seed crystal may be a single crystal of a rare earth superconducting composition having a partially melting point higher than the highest partially melting point of the compact, and the portion of the compact having the highest melting point is contacted with the seed crystal.

A rare earth superconducting composition of the present invention has a high grain orientation. This increases critical current density of the composition. The composition has grains and grain boundaries, and a supercurrent is generally interrupted by grain boundaries or cracks present inside the grains so that the loop radius of the supercurrent cannot be larger than the size of each grain.

However, this is not the case with the composition of the present invention. Adjacent grains of the composition of the invention have substantially the same orientation so that the supercurrent can flow through the grains without being interrupted by the grain boundaries and can take a longer path, and the loop radius is not restricted to each grain size, and consequently a supercurrent has a larger loop radius and a higher critical current density. With respect to the Meissner effect, it is necessary for the practical application of a superconductor that the superconductor have a large supercurrent so that it can cancel an external magnetic field. The supercurrent flows through the surface of the superconductor in a circular loop. The larger the radius of the circle or loop, the larger the magnetic levitation force of the superconductor.

Moreover, to have highly uniform orientation of grains is preferable for another reason. $REBa_2Cu_3O_{7-x}$ oxides, which may be the main components of a rare earth superconducting composition of the invention, have a perovskite structure which has anisotropy, and the oxides accordingly show a superconductivity of two-dimensional anisotropy. That is, their critical current density is the largest on the ab face of its crystal lattice and only ⅓ thereof on the bc or ca face of its lattice. Therefore, with a rare earth superconducting composition of the invention of uniform grain orientation, may have the supercurrent density much higher when the composition is used so that the crystal's c axis is in the same direction as a magnetic field applied to the composition, as compared with when the superconductor is used so that the crystal's c axis is in a direction perpendicular to the direction of the magnetic field.

In both of the above present processes for obtaining a rare earth superconducting composition of high grain orientation, the noble metal compound is dispersed in a form of particles in the grains of rare earth superconducting composition in the melting step. Such dispersion of particles containing a noble metal in grains is effective for the prevention of growth of cracks, and the dispersion of a large number of small particles is particularly effective in such prevention. It is presumed that these particles act to make short and fine cracks before the cracks start growing. Moreover the portions of the superconductor where the particles are dispersed have higher mechanical strengths. Owing to the synergetic effect thereof, the supercurrent can flow without being interrupted by cracks and excellent superconductivity can be obtained even in a magnetic field.

A source of cracks may be in a cooling step of a rare earth superconducting composition. A phase transition of a rare earth superconducting oxide from cubic system at higher temperatures to rhombic system at lower temperatures takes place at about 700° C. This phase transition gives rise to a contraction in a direction of the c axis of the crystal lattice of the grains, which may cause cracks in grains and grain boundaries. Particularly when cracks are formed along the cleavage surfaces of crystals and thereby the cleavage of crystals is invited, the rare earth superconducting composition obtained gives a supercurrent having a significantly small loop radius and accordingly gives a lower magnetic field caused by the Meissner effect. In some cases, cracks are also formed in crystals by the thermal expansion, thermal impact, etc. caused by the temperature change experienced during production or use of rare earth superconducting composition.

Hereinafter dispersion of particles containing a noble metal in grains is explained in detail with emphasis when a noble metal is silver. A silver compound refers to a compound containing silver, and metallic silver and silver oxide are preferable.

As explained above, a rare earth superconducting composition has grains of a rare earth superconducting oxide, and a plurality of particles are dispersed in each of the grains. The particles include a noble metal. Preferably the noble metal is silver.

Some of the particles have diameters up to 5 μm. The inclusion of silver compound particles in grain has been known even in the conventional melting process, but their particle diameters have been at least 10 μm and generally 20–50 μm. However, such fine dispersion of silver compound particles as seen in the present invention has been unknown.

According to the present invention, a rare earth superconducting composition comprising grains each containing particles of 5 μm or less in diameter containing a silver compound can be obtained by: adding metallic silver powders or silver compound powders to raw material powders for rare earth superconducting composition or calcined powders of rare earth superconducting composition so that the silver content in proportion to the raw material powders and metallic silver powders or silver compound powders becomes 5–12% by weight, to prepare a compact; heating the compact to partially melt it; cooling the compact to the freezing point of the compact at a rate of at least 100° C. per hour; and then gradually cooling to give rise to crystallization of rare earth superconducting composition. Both silver and the silver compound are hereinafter referred to as a silver compound (a generic name). The thus obtained rare earth superconducting composition has a microstructure in which the particles containing silver have particle diameters of 3–5 μm in the periphery of each grain and particle diameters of 20–30 μm in the center of each grain.

The particles in the periphery of the grains may have diameters smaller than diameters of the particles in the center of the grains. Preferably the particles in the periphery of the grains have a volume percentage larger than a volume percentage of the particles in the center of the grains.

It was found in the present invention that fine dispersion of particles containing silver in grains is effective to prevent the growth of cracks, etc. and that the presence of these fine particles in a larger amount in the periphery of each grain than in the center of each grain is particularly effective. These fine particles containing silver act effectively on a large number of short and fine cracks before the cracks start growing. Presumably, the portions of each grain at which the particles are present have higher mechanical strengths locally. Owing to the synergetic effect thereof, the supercurrent generated in the rare earth superconducting composition can flow without being interrupted by cracks and excellent superconductivity can be obtained even in a magnetic field. The particles containing silver finely dispersed in the grain periphery prevent the growth of cracks generated in the grain center and, as a result, the supercurrent generated in the rare earth superconducting composition can easily flow through grains without being interrupted at their boundaries.

In the present process for production of a rare earth superconducting composition, the silver content in compact is 5–12%, preferably 5–10% by weight in terms of silver element. When the silver content is within this range, the silver compound particles are present in a sufficient amount and are finely dispersed in the grains. Moreover, in this range in the periphery of each grain the volume percentage of said particles is larger than the volume percentage of the particles in the center of the grain. This makes difficult the growth of cracks as far as the grain periphery and makes easier the formation of cracks in the grain center. When a thermal stress or the like is applied, the stress is relaxed by the formation of cracks in the grain center; in this case, the growth of cracks as far as the grain periphery is unlikely.

When the silver content is less than 5% by weight, the silver compound particles are dispersed in grains similarly to when the silver content is 5–12% by weight, but the volume percentage of silver compound particles in each grain is small, resulting in low stress relaxability and consequently failing to prevent the growth of cracks to the grain periphery. On the other hand, when the silver content is more than 12% by weight, the diameters of silver compound particles are 20 µm or larger, resulting in low stress relaxability. In this case, no difference in diameters or volume percentage of silver compound particles exists between the grain periphery and the grain center. Thus, cracks tend to grow from grain center to grain periphery unless the silver content is 5% by weight or more.

The reason why the silver compound particles are finely dispersed in each grain in the rare earth superconducting composition produced by the present invention, is not clear yet but is presumed as follows. When the silver content in compact is 12% by weight or less, the silver compound is dissolved when the compact is melted, and it begins to precipitate as its solubility gets lower during the stage of melt cooling to its freezing point. In this case, when the cooling rate is at least 100° C. per hour, the precipitation of silver compound occurs at once and the particles of silver compound formed become fine. When the cooling rate is smaller than 100° C. per hour, the precipitation of silver compound occurs slowly and the particles of silver compound formed become large.

When the silver content in compact is more than 12% by weight, it is difficult to completely dissolve the silver compound when the compact is melted, and part of the silver compound remains undissolved in the form of drops. These drops precipitate during the stage of melt cooling to its freezing point regardless of the degree of the cooling rate, forming large silver particles.

The reason why the volume percentage of silver compound particles is larger in the periphery of each grain than in the center of each grain in the rare earth superconducting composition produced by the present process, is not clear yet, either, but is presumed as follows. When the silver compound content in compact is 12% by weight or less in terms of silver element, the melt of the compact begins to solidify from the portion of lowest silver compound content. It should be noted that the freezing point of the melt is lower as the silver compound content in melt is higher. As grains grow in a melt, a silver compound remains in the melt as long as a silver compound concentration in the melt does not reach its saturation in the melt so that the size and the amount of silver particles are limited in the center of the grains. Consequently, the volume percentage of silver compound is small in the center of each grain. In the period of grain growth the silver compound content in melt increases and the freezing point of melt decreases; as a result, the periphery portion of each grain formed towards the end of grain growth contains a far larger amount of silver compound particles.

In the rare earth superconducting composition of the present invention comprising grains each containing particles of 5 µm or less in diameter consisting essentially of silver or a silver compound, the presence of said fine particles in grain prevents the growth of cracks in each grain. As a result, the supercurrent generated in the rare earth superconducting composition can take a long path without being interrupted by the fine cracks present in each grain and the rare earth superconducting composition has high superconductivity.

In the above-mentioned rare earth superconducting composition of the present invention, the particle diameters of the particles in each grain are smaller and the volume percentage of the particles in each grain is larger, in the periphery of each grain than in the center of each grain. This prevents the growth of cracks in each grain as far as grain boundary. As a result, the supercurrent generated in the rare earth superconducting composition can easily flow through grains without being interrupted at grain boundaries and can have a larger loop radius; the magnetic field generated owing to the Meissner effect is stronger; and the rare earth superconducting composition has high superconductivity.

The present invention is described in more detail below.

The rare earth superconducting composition of the present invention is represented by a formula $REBa_2Cu_3O_{7-x}$. In the formula, RE is at least one element selected from the group consisting of Y, Gd, Dy, Ho, Er and Yb, and x is a number which can be varied between 0 and 1 because the oxygen contents in raw material oxides of $REBa_2Cu_3O_{7-x}$ have a non-stoichiometric relation with each other. x has a direct influence on the superconductivity of the composition. The present rare earth superconducting composition has a feature that the crystal structure is a multi-layered perovskite structure. An example of the main component of the present rare earth superconducting composition is $YBa_2Cu_3O_{7-x}$. The rare earth element represented by RE is not restricted to one element and may be a mixture of two or more elements selected from the group consisting of Y, Gd, Dy, Ho, Er and Yb. This allows the rare earth superconducting composition to have a freedom for desired melting point. An example of such mixed use of rare earth elements is that RE is shown as $Y_yYb_{1-y}$ where y ranges from 0 to 1.

The raw materials for the $REBa_2Cu_3O_{7-x}$ which is the main component of the present rare earth superconducting composition, are an oxide of RE, i.e. Y, Gd, Dy, Ho, Er or Yb; a carbonate, oxide or peroxide of Ba; and an oxide of Cu. Each raw material or a mixture thereof is used in the form of powder, calcined powder, frit powder or the like so as to produce, by firing, $REBa_2Cu_3O_{7-x}$ and $RE_2BaCuO_5$. The kinds and proportions of the raw materials are not particularly restricted as long as the above two oxides are produced in desired proportions. The particle diameters of the raw material powders are not particularly restricted, but are generally in the range of 1–10 μm.

The noble metal refers to silver, gold or a platinum group metal. It is not restricted to only one of these metals and may be a mixture of two or more of these metals. The noble metal compound refers to a compound of such a mixture of two or more compounds of such noble metals. It is possible to use any combination of at least two members selected from the above-mentioned noble metals and noble metal compounds.

In the present invention, the main purpose of addition of a noble metal compound to a rare earth superconducting composition compact is to lower the freezing point of said compact. Therefore, the kind of noble metal compound to be added is not restricted. The addition of silver or silver oxide is preferable in view of the cost. The addition of rhodium or platinum or an oxide thereof is preferable as well.

The noble metal compound contained in the present rare earth superconducting composition is not necessarily the same as those contained in the compact. That is, a possibility exists in which the noble metal compound contained in the compact reacts with some compound during the process for production of rare earth superconducting composition, becoming a different compound. The possibility for the noble metal compound in the compact to react with other compound is low because any noble metal has low reactivity.

The noble metal compound may be added to a mixture of powders of raw material oxides or calcined powders obtained by calcining said raw material oxides. The noble metal compound to be added, preferably has a powder form. Generally, a fine powder having particle diameters of about 20 μm or less is preferred. When the particle diameters exceed about 20 μm, the powder becomes agglomerate and does not decrease a freezing point of a superconducting oxide as much as expected for the added amount.

Preferably the rare earth superconducting composition of the invention containing $REBa_2Cu_3O_{7-x}$ as the main component may contain a platinum group metal (Pt or Rh) or a compound thereof in an amount of 0.01–5% by weight as the platinum group metal. The presence of these metals in the composition prepared in the melt process like the processes of the invention, has an effect of generating fine particles of $RE_2BaCuO_5$ uniformly dispersed in grains. These fine particles act as pinning centers and their presence is preferable. The Pt or Rh or compound thereof may be dispersed uniformly in the rare earth superconducting composition while the other noble metal compound is contained in a controlled concentration distribution. Alternatively, the Pt or Rh or compound thereof itself may be contained in a controlled concentration distribution.

When the content of the above metal or metal compound in the rare earth superconducting composition containing $REBa_2Cu_3O_{7-x}$ as the main component is less than 0.01% by weight as metal, the metal or metal compound has no effect of generating fine particles of $RE_2BaCuO_5$ dispersed in grains. When the content is more than 5% by weight, a large amount of a heterogeneous phase appears, which is not preferable. The Pt or Rh or compound thereof added to the powders of raw material oxides for rare earth superconducting composition, preferably has a powder form. Generally, fine powders having particle diameters of about 5 μm or less is preferred. When the particle diameters are larger than about 5 μm, the powder becomes agglomerate and does not disperse $RE_2BaCuO_5$ particles much.

(1) A calcined powder for the present rare earth superconducting composition or powder(s) of raw material oxides for the present rare earth superconducting composition, (2) a required amount of a noble metal compound powder and (3) other desired components are mixed uniformly to prepare a plurality of mixed powders of different noble metal compound contents.

These mixed powders of different amounts of a noble metal compound are subjected to known molding steps such as press molding, injection molding, cast molding, isotropic press molding or the like so as to form a compact of desired shape in which the noble metal compound is contained in a controlled concentration distribution. In the above formation of said compact, two approaches are possible. In either approach, firstly a plurality of compacts are prepared, each of the compact has a desired shape and uniform constitution, and each compact has different noble metal compound concentration. Then in one approach the compacts are arranged so as to give a desired shape and are vacuum-melted or heated into a semi-molten state. In the other approach, said compacts are arranged as desired and then subjected to isotropic press molding or the like for bonding and integrating them, and the resulting one-piece mass is vacuum-melted or heated into a semi-molten state.

There is another method for obtaining a compact by using press molding for bonding and integration. A first mixed powder is placed in a mold and pressed to obtain a first compact; without taking out the first compact, a second mixed powder is placed on the first compact in the mold and pressing is effected to obtain a laminate; without taking out the laminate, a third powder is placed thereon and pressing is effected to obtain a new laminate; the same procedure is repeated to obtain a final laminate, i.e. a compact.

The compact obtained by either of the above two approaches can have any desired shape. The shape may be, as desired, a column; a prism; a parallelepiped; a rectangular parallelepiped; a cone; a pyramid; a spheroid; a sphere; a shape obtained by subjecting any of the above shapes to plastic deformation in any desired direction; a shape obtained by cutting any of the above shapes in any direction so as to give a flat or curved surface; and a shape obtained by making at least one hole in any of the above shapes, such as cylinder, doughnut or the like.

In the case of a compact of complex shape, for example, a compact whose shape is so complex as to removal from the mold used, it has been very difficult industrially by the conventional temperature gradation process to allow such a compact to have a controlled temperature distribution inside after it has been put in a semi-molten state. In the present noble metal gradation process and seed crystal process, however, even in a compact of complex shape, the concentration of noble metal compound in each portion of the compact can be controlled as desired. Therefore, uniform orientation of grains in sintered material is easier in the present noble metal gradation process and seed crystal process than in the conventional temperature gradation process.

In the present noble metal gradation process, the concentration distribution of noble metal compound in compact of rare earth superconducting composition is preferably controlled so that in the gradually cooling step of the compact, only one single crystal or so-called pseudo-crystal may be formed. It is generally preferable that the compact be prepared so that the portion of highest freezing point is as small as possible. Crystallization can occur at any site of the compact whose temperature has become lower than the freezing point. Hence, if the portion of highest freezing point is too large, there is a high possibility that a plurality of crystals of different orientations be formed, making it difficult to obtain a superconducting composition of good orientation. When no seed crystal is used, the size of the portion of highest freezing point in compact is preferably about 10 μm or less in diameter.

In the present noble metal gradation process, use of the seed crystal process in combination is preferable because it enables production of a large superconducting composition of high orientation in desired direction. When a seed crystal is used, the size of the portion of highest freezing point in compact is preferably such that the distance between the circumference of said portion and the circumference of the contact area is not larger than about 10 mm.

In the present noble metal gradation process, the concentration distribution of noble metal compound in compact is controlled so as to give a desired distribution of freezing point. Therefore, the noble metal compound used need not be one compound and may be a plurality of compounds, and the desired freezing point distribution in compact can be achieved by controlling the concentration distributions of individual compounds. The use of a plurality of noble metal compounds provides a further advantage because it gives a higher freedom for the properties of superconducting composition obtained.

Specific examples of the concentration distribution of noble metal compound in the compact for the present rare earth superconducting composition are shown in FIGS. 2a–2h. As mentioned above, each of the compact is prepared by arranging a plurality of compacts as desired. These compacts are subject to a normal press molding, a isotropic press molding or the like to be bonded together and integrated. Regardless of the method the compact is prepared, the concentration distribution of a noble metal compound in the compact is not restricted to the examples of FIGS. 2a–2h. Concentrations of the compound may monotonously increase in a direction in the compact in any of the examples of FIGS. 2a–2h.

Figure 2B:
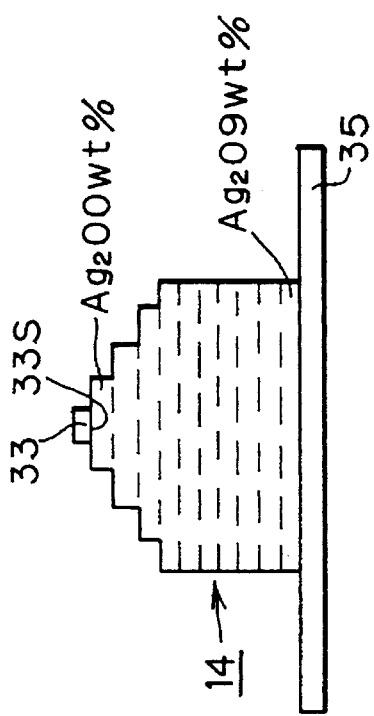
Figure 2C:
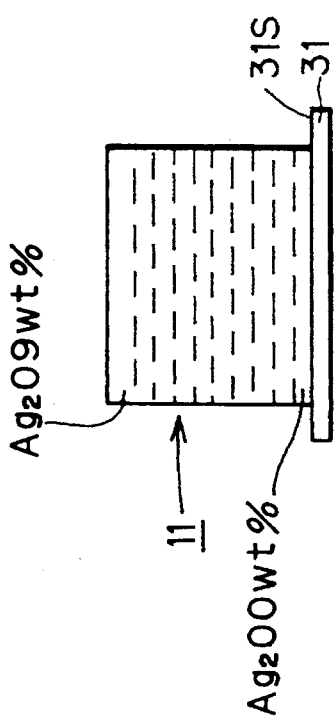
Figure 2D:
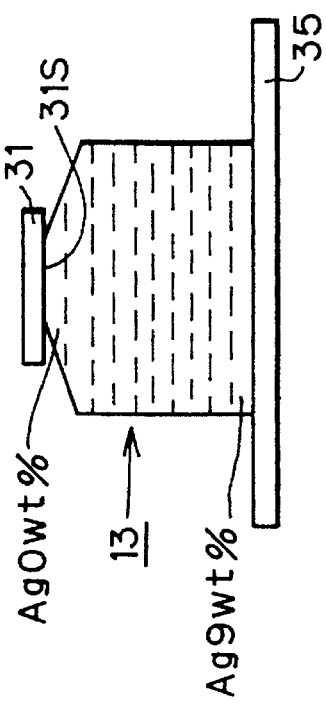

FIGS. 2a–2h show examples of the concentration distribution of noble metal in the compact used in the noble metal gradation process of the present invention. FIGS. 2a to 2d are examples of the concentration distribution of noble metal (FIGS. 2b and 2c) and noble metal oxide (FIGS. 2a and 2d) in the compact used also in the seed crystal process. In FIGS. 2b and 2d, on a compact of a rare earth superconducting composition containing a noble metal compound in a controlled concentration distribution is placed a seed crystal which is a single crystal of a rare earth superconducting composition having a melting point higher than the highest melting point of the compact. In FIGS. 2a and 2c, the (100) surface 31s of a seed crystal 31 which is a thin sheet of a single crystal of MgO, is contacted with a compact in order to provide a starting point of crystallization and achieve controlled grain orientation.

In FIGS. 2a, 2c, 2d, 2e and 2f, various layers of rare earth superconducting compositions each containing a different concentration of a noble metal compound are arranged in a direction perpendicular to the axial direction of a column or prism formed by said arrangement of said layers; and in the column or prism, the concentration of the noble metal compound is on a monotonous increase or decrease in the axial direction.

Figure 2F:
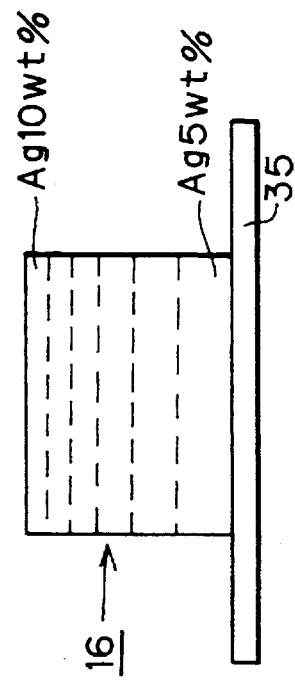
Figure 2H:
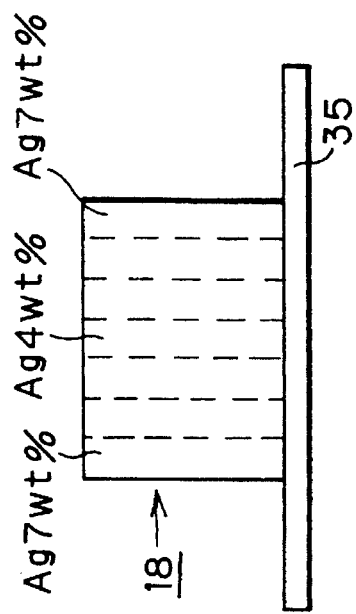
Figure 2E:
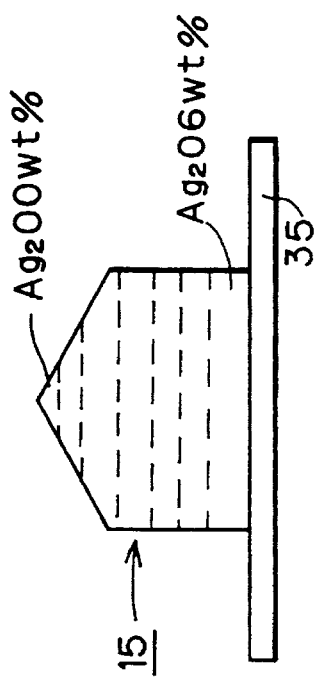
Figure 2G:
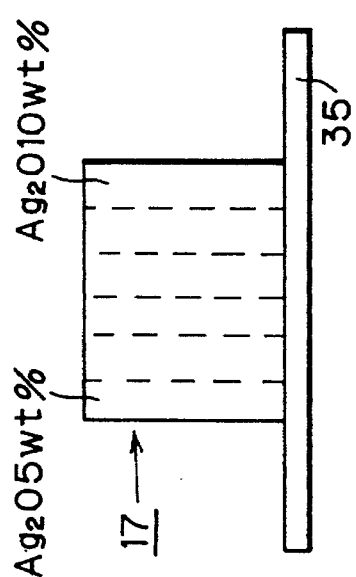

Meanwhile, in FIGS. 2g and 2h, various layers of rare earth superconducting compositions each containing a different concentration of a noble metal compound are arranged in a direction parallel to the axial direction of a column formed by said arrangement of said layers; in the column, the concentration of the noble metal compound is on a monotonous increase or decrease in a direction perpendicular to the axial direction of the column. In FIG. 2h, when the column is seen from above, various layers are arranged in the form of concentric circles, and the concentration of the noble metal compound is lowest in the innermost layer and is on a monotonous increase towards the circumference.

Then, the compact of a rare earth superconducting composition containing a noble metal compound in a controlled concentration distribution is preferably subjected to a vacuum melting step, i.e. vacuum melting and subsequent cooling in the air. In this vacuum melting and subsequent cooling, considerable volume contraction and deformation takes place. For example, a column of FIG. 3a is applied by vacuum melting. The center of the top portion is dented and the center of the side is slightly deformed after vacuum melting and cooling, and the overall shape becomes a hand drum shape as shown in FIG. 3b. Application of surface polishing thereto gives a material in which the concentration distribution of a noble metal compound is as shown in FIG. 3c. In such a concentration distribution, the direction of grain orientation can be controlled not only in a vertical direction but also in a horizontal direction.

Meanwhile in the present seed crystal process, on a compact of a rare earth superconducting composition containing a noble metal compound is placed, at the center, a seed crystal, i.e. a small piece of a single crystal of a rare earth superconducting composition having a higher melting point than said compact; then, they are heated, by a desired known method, to a temperature between the melting point of the seed crystal and the melting point of the compact to put only the compact in a semi-molten state. When the noble metal compound is contained in the compact in a controlled concentration distribution and as a result the compact has no single melting point, the melting point of the seed crystal must be higher than the highest melting point of the compact. In this case, the site of the compact on which the seed crystal is placed, is the center of the portion of the compact having the highest melting point.

As the seed crystal, there may be also used single crystals of oxides such as $SrTiO_3$, $MgO$, $LaAlO_3$, $LaGaO_3$, $NdGaO_3$, $PrGaO_3$ and the like. In this method, the polished (100) surface of a single crystal of one of these oxides is contacted with a compact; they are heated to put only the compact in a semi-molten state; then, they are gradually cooled to a temperature below the freezing point of the compact to give rise to crystallization. Since the (100) surface of the oxide single crystal is close to the ab surface of the rare earth superconducting composition compact in lattice constant, it is possible to, by the above method, selectively grow the ab surface of the rare earth superconducting composition on the (100) surface of the oxide single crystal. Further, since the melting point of the oxide single crystal is 1,500° C. or above and is far higher than the melting point of the compact, use of the seed crystal imposes no restriction on the temperature at which the compact is put in a semi-molten state. In this case, the area of the contact surface of the oxide single crystal as seed crystal is preferably larger than the contact area of the compact. The reason is as follows. The compact which is a rare earth superconducting composition, has a tetragonal system while the oxide single crystal has a cubic system and the (100), (010) and (001) surfaces thereof are equivalent to each other. Therefore, if there is used, as the seed crystal, an oxide single crystal having a contact area smaller than the area of the contact surface of a compact, the ab surface of a rare earth superconducting composition is formed on each of the (100), (010) and (001) surfaces of the oxide single crystal and crystallization proceeds in a plurality of directions. Consequently, there is obtained no superconducting oxide of uniform orientation.

In the present noble metal gradation process, the temperature at which a compact of a rare earth superconducting composition is put into a semi-molten state may range from a lower temperature end at which the main component of the compact is melted and decomposed into a solid phase of $RE_2BaCuO_5$ and a liquid phase to a higher temperature end at which a solid phase of $RE_2BaCuO_5$ undergoes redecomposition into a solid phase of $RE_2O_5$ and a liquid phase. The temperature to be set as above differs depending upon the kind of rare earth element (Y, Gd, Dy, Ho, Er or Yb) used and the kind and amount of noble metal compound used, and may be appropriately selected in consideration also of the size of compact obtained, the presence or absence of seed crystal and kind thereof, the heating condition, etc. Specifically, the temperature may be appropriately selected in the range of about 990°–1,150° C., about 1,020°–1,180° C., about 1,000°–1,160° C., about 980°–1,140° C., about 960°–1,120° C. or about 890°–1,150° C. when the rare earth element is Y, Gd, Dy, Ho, Er or Y, respectively.

The compact is kept in a semi-molten state at a given temperature, such as above, for a given length of time for partially melting the compact. The time length is not particularly restricted and, similarly to the above heating temperature, can be appropriately selected depending upon the heating condition, etc., but is generally 20 minutes to 2 hours.

Then, the melt is rapidly cooled to about its freezing point. The cooling condition is important. That is, the cooling is conducted to the freezing point or a lower temperature by quenching at a rate of at least 100° C. per hour. When the cooling rate is less than 100° C. per hour, the silver compound particles in each grain are large and no fine particles of 5 μm or less are obtained. The end point of quenching is determined depending upon the freezing point of the compact because the freezing point of the compact is lower than the freezing point of $REBa_2Cu_3O_{7-x}$ depending upon the kind of rare earth element substituted and/or the amount of silver compound added. When the end point of quenching is too high, the silver compound particles in each grain are large and, when the end point is too low, the grain size is small, which are both unpreferable.

Subsequently, the compact is gradually cooled in the same manner as in an ordinary melting process. The temperature at which the gradual cooling is started, is about 5° C. higher than the freezing point of the compact; the temperature at which the gradual cooling is stopped, is about 30° C. lower than said freezing point. The rate of gradual cooling is preferably 0.1°–1° C. per hour. When the compact has a range of freezing points, the starting temperature of gradual cooling is about 5° C. higher than the highest freezing point of the compact and the lowest temperature of gradual cooling is about 15° C. lower than the lowest freezing point of the compact, and the rate of gradual cooling is preferably 0.2°–2° C. per hour. When there is used, as the seed crystal, a single crystal of a rare earth superconducting composition having a melting point higher than that of the compact, gradually cooling is preferably started from the temperature at which the compact is put in a semi-molten state, because there occurs diffusion of the seed crystal into the compact in the vicinity of the portion of the compact contacting with the seed crystal and consequently said portion of the compact comes to have a higher freezing point. In the case of, for example, $YBa_2Cu_3O_{7-x}$ containing 0–10% by weight of silver, gradually cooling is preferably conducted from 1,015° C. to 940° C. at a rate of 1° C. per hour.

In the noble metal gradation process of the present invention, the rare earth superconducting composition compact of semi-molten state is then gradually cooled. In the gradually cooling, crystallization starts from the point of the compact having the highest freezing point and proceeds to the portion of lower freezing point, whereby a rare earth superconducting composition of high orientation is obtained. The rare earth superconducting composition compact is beforehand prepared so as to have a controlled freezing point distribution and give crystallization as mentioned above.

Meanwhile, in the seed crystal process of the present invention, only the compact having a melting point lower than that of the seed crystal arranged in contact with the compact is put in a semi-molten state and then gradually cooled, whereby crystallization starts from the portion of the compact contacting with the seed crystal having a lattice constant similar to that of the compact and a rare earth superconducting composition of high orientation in a desired direction can be obtained. In the seed crystal process, the compact of a rare earth superconducting composition containing a noble metal compound may have a uniform constitution, but preferably contains said noble metal or said noble metal compound in a controlled concentration distribution because such a concentration distribution of noble metal compound enables easy production of a large rare earth superconducting composition of high orientation in a desired direction.

The rare earth superconducting composition after gradually cooling is heat-treated in an oxygen atmosphere at a given temperature in the same manner as in a known melting process, whereby the main component ($REBa_2Cu_3O_{7-x}$) in said rare earth superconducting composition is allowed to absorb oxygen to adjust the value of x to a positive real number of 0.2 or less so that the resulting rare earth superconducting composition can exhibit superconductivity. The heat treatment in an oxygen atmosphere is ordinarily conducted at 600° C. for 5–10 hours, at 500° C. for 10–20 hours and at 400° C. for 20–50 hours in this order.

Thus, in the noble metal gradation process of the present invention, a compact of a rare earth superconducting composition containing a noble metal compound in a controlled concentration distribution is prepared (this compact has a controlled distribution of freezing point); the compact is heated to a semi-molten state and then gradually cooled; during the gradual cooling, crystallization starts from the portion of the compact having the highest freezing point and proceeds to the portion of lower freezing point; thereby, a rare earth superconducting composition of high orientation can be obtained. In this case, by utilizing the property of a rare earth superconducting composition that its freezing point is lower when it contains a noble metal compound, the freezing point distribution in the compact is controlled beforehand at its preparation so that in the compact, crystallization can start from the portion of highest freezing point and proceed to the portion of lower freezing point.

In the seed crystal process of the present invention, on a compact of a rare earth superconducting composition containing a noble metal compound is placed, as a seed crystal, a single crystal of a rare earth superconducting composition having a melting point higher than that of the compact; then, the seed crystal and the compact are heated to a temperature between their melting points to bring only the compact into a semi-molten state; thereafter, gradual cooling is conducted to give rise to crystallization starting from the portion of the compact contacting with the seed crystal; thereby, a rare earth superconducting composition of high orientation in a desired direction can be obtained. This seed crystal process has a feature that there are used, as a compact, a rare earth superconducting composition containing a noble metal compound and accordingly having a freezing point lower than that of a seed crystal used together and, as said seed crystal, a single crystal of a rare earth superconducting composition having a melting point higher than that of the compact.

In the seed crystal process, the compact of a rare earth superconducting composition containing a noble metal compound may have a uniform constitution, but preferably contains said noble metal or said noble metal compound in a controlled concentration distribution because such a concentration distribution of noble metal compound enables easy production of a rare earth superconducting composition of high orientation in a desired direction, which has a large size.

The present invention is hereinafter described in more detail by way of Examples. However, the present invention is not restricted to the following Examples.

EXAMPLE 11

To a mixture of $Y_2O_3$ powders, $BaO_2$ powders and CuO powders in a molar ratio of 0.9:2.4:3.4. was added 0.5% by weight of platinum powders. They were placed in a dry type pot mill and mixed for 6 hours. The mixed powder was spread on a silver plate which was placed in an atmosphere consisting of oxygen and nitrogen (1:4 in volume ratio), and calcined at 700° C. for 10 hours. The calcined material was ground in a rotary mill using zirconia balls, for 15 hours to obtain calcined powders of $YBa_2Cu_3O_{7-x}$ having an average particle diameter of about 3 μm.

The calcined powders of $YBa_2Cu_3O_{7-x}$ were mixed with 1, 2, 3, 4, 5, 6, 7, 8 and 9% by weight of silver oxide powders having an average particle diameter of about 2 μm to obtain 9 kinds of mixtures different only in silver oxide concentrations. For convenience, the calcined powder of $YBa_2Cu_3O_{7-x}$ itself containing no silver oxide powder is herein called also as a mixture; therefore, 10 kinds of mixtures of different silver oxide concentrations were obtained. Each mixture was mixed for 64 hours in a dry type pot mill to obtain 10 kinds of mixed powders of different silver oxide concentrations each having an average particle diameter of about 3 μm. This method for preparation of raw material mixed powders using no $BaCuO_2$ is herein called as method 1 for raw material preparation.

15 g of the mixed powders containing no silver oxide were placed in a cylindrical mold of 50 mm in internal diameter and subjected to press molding under a load of 2 tons to prepare a disc-shaped compact of 50 mm in diameter and about 2.7 mm in thickness. On the compact in the mold was further placed 15 g of the mixed powder containing 1% by weight of silver oxide, and the same press molding was applied to prepare a disc-shaped laminate consisting of two layers each of which extends in a horizontal direction. On the laminate was placed 15 g of the mixed powder containing 2% by weight of silver oxide, and the same press molding was applied to prepare a new disc-shaped laminate consisting of three layers each extending in a horizontal direction. This procedure was repeated to obtain a columnar laminate consisting of 10 layers each extending in a horizontal direction, wherein the silver oxide concentration increased from 0% by weight to 9% by weight upwards (see FIG. 2a). The columnar laminate was subjected to isotropic press molding under a load of 500 kgf/cm² at room temperature to obtain a laminated columnar compact of 46 mm in diameter and 25 mm in height where 1 kgf is equivalent to 9.80665N.

The laminated columnar compact 11 was placed on a square MgO single crystal plate 31 of 50 mm×50 mm×0.5 mm (thickness) having a polished planar surface 31s of the (100) surface of the crystal lattice so that the layer of the compact containing no silver oxide contacted with the polished surface 31s of the single crystal plate, as shown in FIG. 2a. They were placed in an electric furnace in an air and the laminated compact 11 was partially melted at 1,100° C. for 1 hour, then it was cooled from 1,100° C. to 1,015° C. at a rate of 100° C. per hour. Then, the compact was slowly cooled from 1,015° C. to 950° C. at a rate of 0.1°–1.0° C. per hour to subject the compact to crystallization on the single crystal plate. Thereafter, the atmosphere in the furnace was changed to an oxygen atmosphere and a heat treatment was conducted at 650°–400° C. for 50 hours to obtain a columnar rare earth superconducting composition (a so-called pseudo single crystal) of about 40 mm in diameter and about 15 mm in height.

The columnar rare earth superconducting composition was visually observed for its entire surface, which showed neither grain boundary nor crack.

The columnar rare earth superconducting composition of about 40 mm in diameter and about 15 mm in height was also measured for repulsive force against a permanent magnet. A columnar Sm-Co permanent magnet of 20 mm in diameter and 10 mm in height having a surface magnetic flux density of 2,500 G was arranged with one of the circular surfaces directed downward. The columnar rare earth superconducting composition was dipped in liquid nitrogen and allowed to express superconductivity, and immediately one of the circular surfaces of the columnar composition was pressed onto the upper circular surface of the permanent magnet. When the gap between the two circular surfaces of the composition and the permanent magnet was 0.1 mm, a repulsive force was measured by a load cell. Five samples were measured for respective repulsive forces, giving an average of 10.5 kgf. This measurement is called as measurement of levitation force.

Further, the columnar rare earth superconducting composition was cut in various arbitrary directions and the sections were observed using a polarizing microscope having a magnification of 50. Neither grain boundary nor crack was seen in these sections.

Next, thin plates were cut off from the columnar rare earth superconducting composition and measured for grain orientation using an X-ray diffractometer. The c axis of each crystal grain was oriented in a direction of the columnar axis. Thus, since neither grain boundary nor crack was seen in the arbitrarily selected sections and uniform grain orientation was seen in the cut off thin plates, the rare earth superconducting composition is judged to be a single crystal.

The test conditions used above and the test results obtained are shown in Tables 1 and 2.

TABLE 1

Figure 4B:
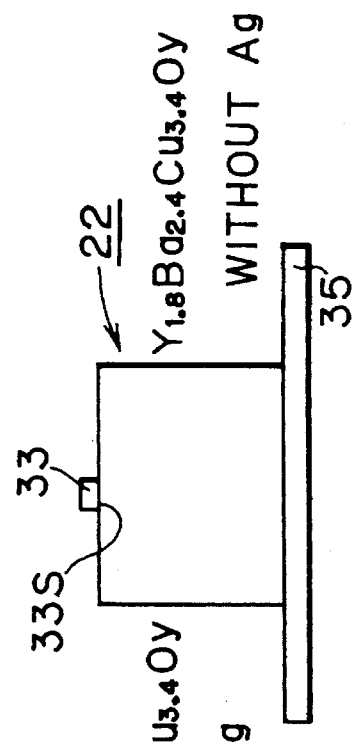
FIGS. 4a–4d show cross sections of conventional rare earth superconducting compositions or compacts thereof, wherein the concentration of noble metal or noble metal compound is zero or is uniform.
Figure 4A:
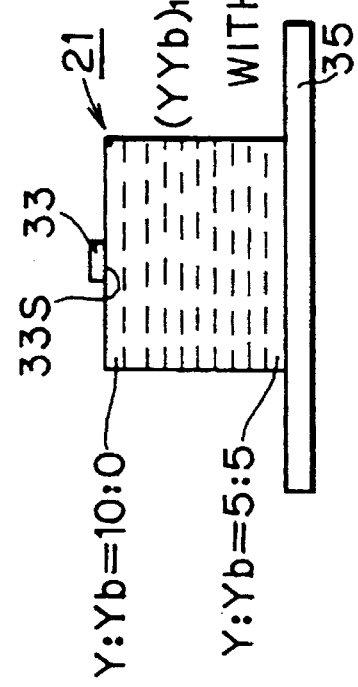
Figure 4D:
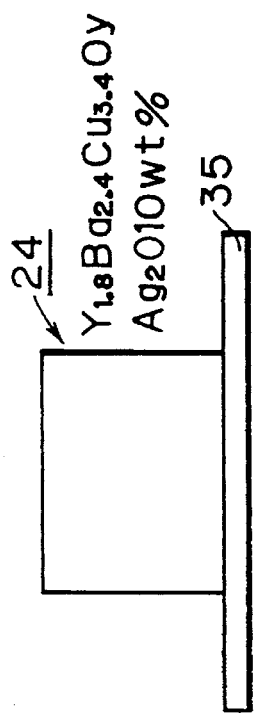
Figure 4C:
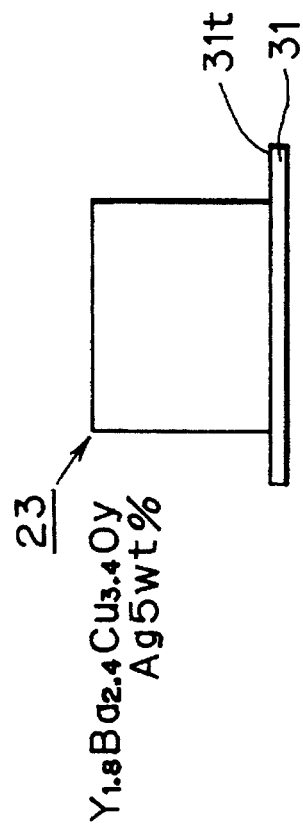

| | Size of Sample Obtained | Method for raw material preparation | Shape of Compact | Vacuum melting | Melting conditions (Temp. × time) | Slowly cooling temperature Start | End |
|---|---|---|---|---|---|---|---|
| Examples | | | | | | | |
| 11 | 40 mm (diameter) 15 mm (height) | Method 1 | FIG. 2a | Not conducted | 1,100° C. × 1 Hour | 1,015° C. | 950° C. |
| 12 | 40 mm (diameter) 15 mm (height) | Method 2 | FIG. 2b | Conducted | 1,000° C. × 1 Hour | 1,000° C. | 950° C. |
| 13 | 40 mm (diameter) 15 mm (height) | Method 1 | FIG. 2c | Conducted | 1,100° C. × 1 Hour | 1,015° C. | 950° C. |
| 14 | 40 mm (diameter) 15 mm (height) | Method 2 | FIG. 2d | Not conducted | 1,030° C. × 1 Hour | 1,030° C. | 950° C. |
| 15 | 40 mm (diameter) 15 mm (height) | Method 1 | FIG. 2e | Conducted | 1,100° C. × 1 Hour | 1,015° C. | 950° C. |
| 16 | 40 mm (diameter) 15 mm (height) | Method 2 | FIG. 2f | Not conducted | 1,100° C. × 1 Hour | 985° C. | 940° C. |
| 17 | 40 mm (diameter) 15 mm (height) | Method 2 | FIG. 2g | Not conducted | 1,100° C. × 1 Hour | 985° C. | 940° C. |
| 18 | 40 mm (diameter) 15 mm (height) | Method 1 | FIG. 2h | Conducted | 1,100° C. × 1 Hour | 990° C. | 960° C. |
| 19 | 100 mm (diameter) 20 mm (height) | Method 1 | FIG. 2b | Conducted | 1,000° C. × 1 Hour | 1,000° C. | 950° C. |
| Comparative Examples | | | | | | | |
| 11 | 40 mm (diameter) 15 mm (height) | Method 1 | FIG. 4a | Conducted | 1,030° C. × 1 Hour | 1,030° C. | 930° C. |
| 12 | 40 mm (diameter) 15 mm (height) | Method 2 | FIG. 4b | Not conducted | 1,030° C. × 1 Hour | 1,030° C. | 930° C. |
| 13 | 40 mm (diameter) 15 mm (height) | Method 2 | FIG. 4c | Conducted | 1,100° C. × 1 Hour | 1,015° C. | 950° C. |
| 14 | 40 mm (diameter) 15 mm (height) | Method 2 | FIG. 4d | Not conducted | 1,100° C. × 1 Hour | 1,000° C. | 900° C. |

TABLE 2

| | Slowly cooling rate (°C./hr) | Number of grains | Orientation | Cracks | Levitation force[*1] (kgf) Minimum | Maximum | Average |
|---|---|---|---|---|---|---|---|
| Examples | | | | | | | |
| 11 | 0.2–1.0 | 1 | excellent | Not Present | 9.3 | 12.1 | 10.5 |
| 12 | 1.0 | 1 | excellent | Not Present | 10.1 | 12.2 | 11.2 |
| 13 | 0.2–1.0 | 1 | excellent | Not Present | 7.8 | 11.2 | 9.3 |
| 14 | 1.0 | 1 | excellent | Not Present | 8.2 | 11.8 | 9.8 |
| 15 | 1.0 | 1 | very good | Not Present | 5.8 | 11.3 | 7.8 |
| 16 | 0.2–1.0 | 4 | good | Present | 3.1 | 8.4 | 4.3 |
| 17 | 0.2–1.0 | 2 | good | Present | 4.4 | 9.8 | 5.4 |
| 18 | 0.2–1.0 | 1 | very good | Not Present | 6.5 | 10.8 | 7.2 |
| 19 | 1.0 | 1 | excellent | Not Present | 18[*2] | 25[*2] | 22[*2] |
| Comparative Examples | | | | | | | |
| 11 | 1.0 | 1 | excellent | Not Present | 9.2 | 12.0 | 10.8 |
| 12 | 1.0 | 6 | good | Present | 2.3 | 8.3 | 4.2 |
| 13 | 0.2–1.0 | 4 | good | Present | 4.1 | 8.8 | 6.1 |
| 14 | 1.0 | 10 | poor | Present | 1.8 | 5.8 | 3.3 |

[*1]Levitation force was measured on 5 samples produced under the same conditions, and the minimum, maximum and average values of 5 measurements were reported.
[*2]A permanent Sm—Co magnet was used. The magnet was cylindrical (diameter: 40 mm, height: 10 mm), and had a surface magnetic flux density of 2,500G.

EXAMPLE 12

To a mixture of $BaCO_3$ powders of about 3 μm in particle diameter and CuO powders in equal moles was added 0.54% by weight of a platinum powder. They were mixed in a wet type pot mill for 3 hours. The mixed powder was spread on a high-purity alumina plate which was placed in an oxygen stream, and calcined at 1,000° C. for 10 hours to obtain a calcined material of $BaCuO_2$. The calcined material was ground in a rotary mill using zirconia balls, for 15 hours to obtain a calcined powder of $BaCu_2O$ having an average particle diameter of about 5 μm.

$Y_2O_3$ powders, the $BaCuO_2$ powders obtained above and a CuO powders were taken so as to give a molar ratio of 0.9:2.4:1.0. Thereto was added 3, 4, 5, 6, 7 or 8% by weight of silver powders having an average particle diameter of about 1 μm to prepare 6 kinds of mixtures different only in silver concentration. Each mixture was mixed in a dry type pot mill for 64 hours to prepare 6 kinds of mixed powders of different silver concentrations. This method for preparation of raw material mixed powders via $BaCuO_2$ is herein called as method 2 for raw material preparation.

15 g of each of the mixed powders was placed in a cylindrical mold of 50 mm in inside diameter and subjected to press molding under a load of 2000 kgf to prepare 6 kinds of disc-shaped material of different silver concentrations. Each of these disc-shaped materials was subjected to isotropic press molding at 500 kgf/cm$^2$ at room temperature to obtain 6 kinds of disc-shaped compacts of 46 mm in diameter and 2.5 mm in height having different silver concentrations. As shown in FIG. 3a, these compacts were laminated on a high-purity alumina plate so that the compact 12 containing 8% by weight of silver contacted with the alumina plate 35 and the silver concentration in compact became gradually lower upwards.

The above-obtained laminated compact 12 on the alumina plate 35 was placed in an electric furnace whose inside was kept in vacuum, and was heated to 1,010° C. for partially melting. Then, the furnace inside was changed to an air atmosphere, and the laminated compact was kept at 1,100° C. for 1 hour to put in a molten state and then cooled to room temperature. This is called as vacuum melting. As shown in FIG. 3b, the laminated compact 12 consisting of 6 layers of different silver concentrations was integrated; at the same time, the center of the upper surface of the column 12, i.e., the laminated compact, was dented and the center of the side of the column was slightly deformed; and the overall shape became a hand drum shape.

The upper surface and side of the column were dented or deformed in their center, and the column were polished to obtain a column with no deformation. The section of the column after polishing was observed by electron probe microanalysis (EPMA). As shown in FIG. 3c, the upper surface had a silver concentration distribution of concentric circles, that is, the silver concentration was lowest at the center and higher towards the circumference.

The column 12 after polishing was placed on a high-purity alumina plate 35 so that the surface of the column containing 8% by weight of silver contacted with the alumina plate. A single crystal 32 of $YBa_2Cu_3O_{7-x}$ of about 4 mm×5 mm containing no silver compound was placed on the center of the upper surface of the column so that the cleaved ab surface 32s of the single crystal 32 contacted with the column (FIG. 2b). Then, they were placed in an electric furnace in an air atmosphere and kept at 1,000° C. for 1 hour to partially melt the compact. In the furnace and the atmosphere, the compact was gradually cooled from 1,000° C. to 950° C. at a rate of 1.0° C. to give rise to crystallization of a rare earth superconducting composition on the alumina plate. Thereafter, the atmosphere in the furnace was changed to an oxygen atmosphere and subjected to a heat treatment at 650°–400° C. for 50 hours to obtain a columnar rare earth superconducting composition.

The columnar rare earth superconducting composition was visually observed for its entire surface, which showed neither grain boundary nor crack.

The columnar rare earth superconducting composition of about 40 mm in diameter and about 15 mm in height was also measured for repulsive force against a permanent magnet in the same manner as in Example 11. Five samples were measured for respective repulsive forces, giving an average of 11.2 kgf.

Further, the columnar rare earth superconducting composition was cut in various arbitrary directions and the sections were observed using a polarizing microscope having a magnification of 50. Neither grain boundary nor crack was seen in these sections.

Next, thin plates were cut off from the columnar rare earth superconducting composition and measured for grain orientation using an X-ray diffractometer. The c axis of each crystal grain was oriented in a direction of the columnar axis. Thus, since neither grain boundary nor crack was seen in the arbitrarily selected sections and uniform grain orientation was seen in the cut off thin plates, the rare earth superconducting composition is judged to be a single crystal.

The test conditions used above and the test results obtained are shown in Tables 1 and 2.

EXAMPLES 13 AND 15–18

In each of Examples 13 and 15–18, a $YBa_2Cu_3O_{7-x}$ columnar compact 10 for rare earth superconducting composition of 40 mm in diameter and 15 mm in height was produced by a noble metal gradation process. In Examples 13, 16 and 18, the concentration of metallic silver was controlled and, in Examples 15 and 17, the concentration distribution of silver oxide was controlled.

In the columns of Examples 13, 15 and 16, as shown in FIGS. 2c, 2e and 2f, layers each containing a different concentration of silver or silver oxide and extending in a horizontal direction were laminated in a direction of the columnar axial direction so that the concentration of silver or silver oxide was on a monotonous increase or decrease in the columnar axial direction. In Example 13, there was produced a compact 13 consisting of 10 laminated layers each containing a different concentration ranging from 0 to 9% by weight of silver and extending in a horizontal direction (FIG. 2c); the (100) surface 31S of a thin plate of a MgO single crystal 31 was contacted with the upper surface of the compact to provide a starting point of crystallization of a rare earth superconducting composition; and the grain orientation of the rare earth superconducting composition was controlled by a noble metal gradation process. In Example 15, there was produced a compact 15 consisting of 7 laminated layers each containing a different concentration, ranging from 0 to 6% by weight, of silver oxide and extending in a horizontal direction (FIG. 2e). In Example 16, there was produced a compact 16 consisting of 6 laminated layers each containing a different concentration, ranging from 5 to 10% by weight of silver and extending in a horizontal direction (FIG. 2f).

In the columns 17, 18 of Example 17 (FIG. 2g) and Example 18 (FIG. 2h), layers each containing a different concentration of silver oxide or silver and extending in a direction of the columnar axis were laminated so that the concentration of silver oxide or silver changed in a direction perpendicular to the columnar axial direction. In Example 17, the concentration of silver oxide was on a monotonous increase from 5 to 10% by weight in a direction perpendicular to the columnar axial direction (FIG. 2g). In Example 18, the concentration of silver was distributed in coaxial cylinders, that is, the silver concentration was 4% by weight at the cylindrical axis portion and was on a monotonous increase towards the cylinder circumference from 4 to 7% by weight at intervals of 1% by weight (FIG. 2h).

The test conditions used and the test results obtained are shown in Tables 1 and 2.

EXAMPLE 14

In Example 14, there was produced, by a seed crystal process, a columnar $YBa_2Cu_3O_{7-x}$ superconducting composition of 40 mm in diameter and 15 mm in height which had the same shape as in Examples 11–13 and 15–18. There was produced, by the method 2 for raw material preparation and without using the vacuum melting step, a compact 14 consisting of 10 laminated layers each containing a different concentration, ranging from 0 to 9% by weight at intervals of 1% by weight, of silver oxide and extending in a horizontal direction. Incidentally, the concentration distribution of silver oxide in this compact was similar to that of silver in Example 13 using a noble metal gradation process. However a shape of the compact 14 of Example 14 is little different from compact 13 of Example 13. A single crystal 33 of $SmBa_2Cu_3O_{7-x}$ of about 4 mm×5 mm containing no silver compound was placed on the center of the upper surface of the column so that the cleaved surface 33s of the single crystal 33 contacted with the column (FIG. 2d).

The test conditions used and the test results obtained are shown in Tables 1 and 2.

EXAMPLE 19

In Example 19, a large columnar $YBa_2Cu_3O_{7-x}$ superconducting composition of 100 mm in diameter and 20 mm in height was produced. In contrast the size of those produced in Examples 11–18 was 40 mm in diameter and 15 mm in height. In Example 19, an $YBa_2Cu_3O_{7-x}$ superconducting composition containing silver in a concentration distribution ranging from 3 to 8% by weight was produced by a seed crystal process in the same conditions as in Example 12 except that the raw material powders were prepared in the method 1 for raw material preparation in place of the method 2 for raw material preparation used in Example 12.

The test conditions used and the test results obtained are shown in Tables 1 and 2.

COMPARATIVE EXAMPLE 11

$Y_2O_3$ powders, $BaO_2$ powders and $CuO$ powders were taken so as to give a molar ratio of 0.9:2.4:3.4. Thereto was added 0.5% by weight of platinum powders to prepare a mixed powder. In the same manner as above except that part of $Y_2O_3$ was substituted with $Yb_2O_3$, that is, 5 to 50 mole % of $Y_2O_3$ was substituted with $Yb_2O_3$ at intervals of 5 mole %, there were further prepared 10 more mixed powders having different degrees of substitution of Y with Yb. Each of the thus prepared 11 mixed powders was mixed in a dry type pot mill for 6 hours, after which it was spread on a silver plate in a mixed gas stream consisting of oxygen and nitrogen (1:4 by volume ratio) and calcined at 700° C. for 10 hours to obtain 11 calcined materials of $Y_{1-a}Yb_aBa_2Cu_3O_{7-x}$ (a=b/20; b is an integer of 0–10). Each calcined material was ground in a dry type pot mill for 64 hours to obtain 11 calcined powders of $Y_{1-a}Yb_aBa_2Cu_3O_{7-x}$ (a=b/20; b is an integer of 0–10) each having a different degree of substitution of Y with Yb and having an average particle diameter of about 3 μm. These calcined powders contained neither silver nor silver oxide.

15 g of each calcined powder was placed in a cylindrical mold of 50 mm in inside diameter and subjected to press molding under a load of 2 tons to prepare 11 disc-shaped materials each having a different degree of substitution of Y with Yb. Each of the disc-shaped materials was subjected to isotropic press molding at 500 kgf/cm² at room temperature to prepare 11 disc-shaped compacts each of 46 mm in diameter and 2.5 mm in height having a different degree of substitution of Y with Yb.

As shown in FIG. 4a, the disc-shaped compacts 21 were laminated on a high-purity alumina plate so that the compact of 50 mole % substitution of Y with Yb contacted with the alumina plate 15 and the degree of substitution of Y with Yb decreased gradually upwards. A $SmBa_2Cu_3O_{7-x}$ single crystal 33 of about 4 mm×5 mm containing no silver was placed on the uppermost compact layer ($YBa_2Cu_3O_{7-x}$ containing no Yb) so that the cleaved ab surface 33s of the single crystal contacted with the uppermost compact layer.

The disc-shaped laminated compact on the alumina plate 35 was kept at 1,030° C. for 1 hour in an electric furnace in an air atmosphere to put the compact in a semi-molten state for integration and, in the furnace in the atmosphere, was gradually cooled from 1,030° C. to 930° C. at a rate of 1.0° C. per hour to give rise to crystallization of a superconducting composition on the alumina plate. Then, the atmosphere in the furnace was changed to an oxygen atmosphere and a heat treatment was conducted at 650°–400° C. for 50 hours to obtain a columnar rare earth superconducting composition.

The columnar rare earth superconducting composition was visually observed for its entire surface, which showed neither grain boundary nor crack.

The columnar rare earth superconducting composition of about 40 mm in diameter and about 15 mm in height was also measured for repulsive force against a permanent magnet in the same manner as in Example 11. Five samples were measured for respective repulsive forces, giving an average of 10.8 kgf.

Further, the columnar rare earth superconducting composition was cut in various arbitrary directions and the sections were observed using a polarizing microscope having a magnification of 50. Thin plates were cut off from the columnar rare earth superconducting composition and measured for grain orientation using a transmission electron microscope. The c axis of each crystal grain was oriented in a direction of the columnar axis.

The test conditions used and the test results obtained are shown in Tables 1 and 2.

COMPARATIVE EXAMPLES 12–14

In each of Comparative Examples 12 and 13, an $YBa_2Cu_3O_{7-x}$ superconducting composition was produced using a seed crystal process alone (no noble metal gradation process was used). In Comparative Example 14, an $YBa_2Cu_3O_{7-x}$ superconducting composition was produced without using any of a noble metal gradation process and a seed crystal process. In Comparative Examples 12–14, the compacts had uniform constitutions without gradiaton of a noble metal.

In Comparative Example 12 (FIG. 4b), a mixed powder of $YBa_2Cu_3O_{7-x}$ containing no silver was prepared by the method 2 for raw material preparation. In Comparative Example 13 (FIG. 4c), a mixed powder of $YBa_2Cu_3O_{7-x}$ containing 5% by weight of silver was prepared by the method 2 for raw material preparation. In Comparative Example 14 (FIG. 4d), a mixed powder of $YBa_2Cu_3O_{7-x}$ containing 10% by weight of silver was prepared by the method 2 for raw material preparation.

150 g of each of the mixed powders was placed in a cylindrical mold of 50 mm in inside diameter and subjected to press molding under a load of 2 tons to prepare 3 columnar compacts. Each compact was subjected to isotropic press molding at 500 kgf/cm$^2$ at room temperature to prepare 3 columnar compacts of 46 mm in diameter and 25 mm in height.

In Comparative Example 12, a $SmBa_2Cu_3O_{7-x}$ single crystal 33 of about 4 mm×5 mm containing no silver was placed on the upper surface of the column 22 layer ($YBa_2Cu_3O_{7-x}$ containing no Yb) so that the cleaved ab surface 33s of the single crystal contacted with the uppermost compact layer. The column 22 was placed on an aluminum plate 35.

In Comparative Example 13, the column 23 was placed on a polished planar surface 31t of the (100) surface of a square MgO single crystal plate 31 of 50 mm×50 mm×0.5 mm (thickness), as shown in FIG. 4c.

Then, 3 columnar rare earth superconducting compositions were produced under the conditions shown in Tables 1 and 2.

The columnar rare earth superconducting compositions were visually observed for the entire surfaces. In any of the compositions, grain boundaries and cracks were observed.

The columnar rare earth superconducting compositions each of about 40 mm in diameter and about 15 mm in height were also measured for repulsive force against a permanent magnet in the same manner as in Example 11. Five samples were measured for respective repulsive forces and the average of 5 measurements was 4.2 kgf in Comparative Example 12, 6.1 kgf in Comparative Example 13 and 3.3 kgf in Comparative Example 14.

Further, each of the columnar rare earth superconducting compositions was cut in various arbitrary directions and the sections were observed using a polarizing microscope having a magnification of 50. Thin plates were cut off from each of the columnar rare earth superconducting compositions and measured for grain orientation using a transmission electron microscope. In each columnar rare earth superconducting composition, the c axis of each crystal grain was oriented in a direction of the columnar axis.

The test conditions used and the test results obtained are shown in Tables 1 and 2.

The $YBa_2Cu_3O_{7-x}$ superconducting compositions obtained in Examples 11–19, as compared with those obtained in Comparative Examples 12–14, have larger crystal grains and higher grain orientation owing to the adoption of a noble metal gradation process during their production to allow each of the respective compacts to have a controlled freezing point distribution. Further, the $YBa_2Cu_3O_{7-x}$ superconducting compositions obtained in Examples 11–19 are far superior in superconductivity represented by levitation force to the $YBa_2Cu_3O_{7-x}$ superconducting compositions obtained in Comparative Examples 12–14.

EXAMPLES 21–23

$BaCO_3$ powders and CuO powders each of which have about 3 μm in average particle diameter were taken in equal moles. Thereto was added 0.54% by weight of platinum powders. They were mixed in a wet type pot mill for 3 hours. The mixed powder was spread on a high-purity alumina plate in an oxygen stream and calcined at 1,000° C. for 10 hours to obtain a calcined material of $BaCuO_2$. The calcined material was ground in a rotary mill using zirconia balls for 15 hours to obtain a calcined powder of $BaCuO_2$ of about 5 μm in average particle diameter.

Then, an $Y_2O_3$ powder, the $BaCuO_2$ powder obtained above and a CuO powder were taken so as to give a molar ratio of 0.9:2.4:1.0 (with this, the molar ratio of total Cu became 3.4) and mixed.

In Example 21, 5.5% by weight of a silver oxide powder (5.0% by weight in terms of silver) was further added to the resulting mixture.

In Example 22, 7.7% by weight of a silver oxide powder (7.0% by weight in terms of silver) was further added to the resulting mixture.

In Example 23, 11% by weight of a silver oxide powder (10% by weight in terms of silver) was further added to the resulting mixture.

Each of the resulting mixtures was mixed in a dry type pot mill for 64 hours. 120 g of each of the resulting mixed powders was placed in a cylindrical mold of 50 mm in inside diameter and subjected to press molding under a load of 100 kgf/cm$^2$ and then to isotropic press molding at 500 kgf/cm$^2$ to obtain columnar compacts of about 46 mm in diameter and about 20 mm in height.

Each of the columnar compacts was placed on a high-purity alumina plate and then kept at 1,100° C. for 1 hour in an electric furnace in an air atmosphere to partially melt the compact.

In Example 21, in the same air atmosphere, the partially melt was rapidly cooled from 1,100° C. to 980° C. at a rate of 100° C. per hour and gradually cooled or annealed from 980° C. to 920° C. at a rate of 1.0° C. per hour to give rise to crystallization of $YBa_2Cu_3O_{7-x}$ on the alumina plate to obtain a columnar oxide of 40 mm in diameter and 15 mm in height.

In Example 22, in the same air atmosphere, the partially melt was cooled from 1,100° C. to 975° C. at a rate of 200° C. per hour and gradually cooled from 975° C. to 920° C. at a rate of 1.0° C. per hour to give rise to crystallization of $YBa_2Cu_3O_{7-x}$ on the alumina plate to obtain a columnar oxide of 40 mm in diameter and 15 mm in height.

In Example 23, in the same air atmosphere, the partially melt was cooled from 1,100° C. to 970° C. at a rate of 100° C. per hour and gradually cooled from 970° C. to 920° C. at a rate of 1.0° C. per hour to give rise to crystallization of $YBa_2Cu_3O_{7-x}$ on the alumina plate to obtain a columnar oxide of 40 mm in diameter and 15 mm in height.

Each of the columnar oxides was heat-treated at 700°–400° C. for 50 hours in a furnace containing an oxygen atmosphere to obtain columnar $YBa_2Cu_3O_{7-x}$ superconducting compositions.

Each of the columnar superconducting compositions was subjected to optical polishing at the section, and the polished section was observed for the distribution of cracks in center and periphery of each grain using an optical microscope. In any of Examples 21–23, cracks were observed in the center of each grain but no crack was observed in the periphery of each grain. The test conditions and results are shown in Table 3.

onto the upper circular surface of the permanent magnet to measure, using a load cell, a repulsive force when the gap between the two circular surfaces was 0.1 mm. Five samples were measured for respective repulsive forces and an average of five measurements was calculated. The average was 15 kgf in Example 21, 20 kgf in Example 22 and 18 kgf in

TABLE 3

| | Amount of Ag added (wt %) | Firing Conditions | | Particle diameter of Ag particles (μm) | | Volume percentage of Ag particles (%) | | Critical current density at 77 K under 1T (A/cm$^2$) | Levitation force (kgf) | Distribution of cracks in grain |
|---|---|---|---|---|---|---|---|---|---|---|
| | | Rapid cool Rate (°C./hour) | Initial slow cooling temp. (°C.) | grain periphery | grain center | grain periphery | grain center | | | |
| Examples | | | | | | | | | | |
| 21 | 5 | 100 | 980 | 2 | 24 | 5 | 1 | 29500 | 15 | Cracks are present |
| 22 | 7 | 200 | 975 | 3 | 32 | 6 | 3 | 30300 | 20 | in the grain center |
| 23 | 10 | 100 | 970 | 5 | 32 | 6 | 6 | 28900 | 18 | but not present in the grain periphery. |
| Comparative Examples | | | | | | | | | | |
| 21 | 50 | 100 | 1000 | 32 | 36 | 30 | 29 | 19800 | 8 | Substantially no |
| 22 | 50 | 100 | 970 | 35 | 33 | 28 | 29 | 21000 | 8 | cracks in grain. |
| 23 | 3 | 100 | 990 | 2 | 20 | 5 | 1 | 29800 | 1 | Cracks reach as far |
| 24 | 3 | 100 | 980 | 2 | 21 | 5 | 1 | 31700 | 2 | as the grain periphery. |
| 25 | 7 | 20 | 975 | 14 | 31 | 6 | 4 | 24400 | 5 | Some of the cracks |
| 26 | 10 | 100 | 1000 | 20 | 35 | 6 | 6 | 18600 | 3 | reach as far as the |
| 27 | 15 | 100 | 1000 | 22 | 33 | 9 | 9 | 19800 | 3 | grain periphery. |
| 28 | 20 | 100 | 970 | 35 | 34 | 12 | 12 | 20700 | 3 | |

Microphotographs were taken for the 300 μm×200 μm area of each of the center and periphery of grain and were subjected to image analysis, whereby the 50% particle diameter of silver compound particles and the volume percentage of said particles to YBa$_2$Cu$_3$O$_{7-x}$ superconducting composition were determined. A 50% particle diameter refers to a median of the particle diameter distribution such that 50% of the particles have diameters smaller than the 50% particle diameter. The 50% particle diameter of silver compound particles in grain periphery was 2 μm in Example 21, 3 μm in Example 22 and 5 μm in Example 23; thus, it was a figure which was down one place, as compared with the 50% particle diameter of silver compound particles in grain center, in any of Examples 21–23. The results are shown in Table 3.

About 100 mg of a sample was randomly cut out from the periphery of each columnar YBa$_2$Cu$_3$O$_{7-x}$ superconducting composition and measured for the critical current density Jc (A/cm$^2$) in crystal's ab surface at 77K (temperature) at 1 T (magnetic field), by a method for measurement of degree of magnetization by AC. The critical current density was 29,500 A/cm$^2$ in Example 21, 30,300 A/cm$^2$ in Example 22 and 28,900 A/cm$^2$ in Example 23. The results are shown in Table 3.

Each columnar YBa$_2$Cu$_3$O$_{7-x}$ superconducting composition of 40 mm in diameter and 15 mm in height was measured for repulsive force against a permanent magnet. A columnar Sm-Co permanent magnet of 20 mm in diameter and 10 mm in height having a surface magnetic flux density of 4,000 G was arranged with one of the circular surfaces directed downward. The columnar rare earth superconducting composition was dipped in liquid nitrogen and allowed to express superconductivity, and immediately one of the circular surfaces of the columnar composition was pressed Example 23. This measurement is called as measurement of levitation force.

COMPARATIVE EXAMPLES 21 AND 22

Y$_2$O$_3$ powders, BaCuO$_2$ powders and CuO powders were taken in the same manner as in Examples 21–23. Thereto was added 55% by weight of silver oxide powders (50% by weight in proportion to the silver element). The mixture was mixed in a dry type pot mill and then subjected to press molding and isotropic press molding in this order in the same manner as in Examples 21–23 to obtain two columnar compacts each of about 46 mm in diameter and about 20 mm in height.

In the same manner as in Examples 21–23, each of the columnar compacts was spread on a high-purity alumina plate and then kept at 1,100° C. for 1 hour in an air atmosphere to partially melt the compact.

In the same air atmosphere, the melt was cooled from 1,100° C. to 1,000° C. in Comparative Example 21 and from 1,100° C. to 970° C. in Comparative Example 22, at a rate of 100° C. per hour. The subsequent procedure was the same as in Examples 21–23 to obtain two columnar YBa$_2$Cu$_3$O$_{7-x}$ superconducting compositions.

Each of the columnar superconducting compositions was subjected to optical polishing at the section, and the polished section was observed for the distribution of cracks in center and periphery of each grain using an optical microscope. In any of Comparative Examples 21 and 22, no crack was observed in any of the center and periphery of each grain. In the image analysis for the microphotographs of the center and periphery of grain, the 50% particle diameter of silver compound particles was the same in the grain center and in the grain periphery in both of Comparative Examples 21 and 22, and it was about 30–40 μm.

The critical current density Jc at 77K at 1 T was 19,800 A/cm$^2$ in Comparative Example 21 and 21,000 A/cm$^2$ in Comparative Example 22. Levitation force was 8 kgf in both of Comparative Examples 21 and 22.

COMPARATIVE EXAMPLES 23 AND 24

Y$_2$O$_3$ powders, BaCuO$_2$ powders and CuO powders were taken in the same manner as in Examples 21–23. Thereto was added 3.3% by weight of a silver oxide powder (3% by weight in terms of silver). The mixture was mixed in a dry type pot mill and then subjected to press molding and isotropic press molding in this order in the same manner as in Examples 21–23 to obtain two columnar compacts each of 46 mm in diameter and 20 mm in height.

In the same manner as in Examples 21–23, each of the columnar compacts was spread on a high-purity alumina plate and then kept at 1,100° C. for 1 hour in an air atmosphere to partially melt the compact.

In the same air atmosphere, the melt was cooled from 1,100° C. to 990° C. in Comparative Example 23 and from 1,100° C. to 980° C. in Comparative Example 24, at a rate of 100° C. per hour. The subsequent procedure was the same as in Examples 21–23 to obtain two columnar YBa$_2$Cu$_3$O$_{7-x}$ superconducting compositions.

Each of the columnar superconducting compositions was subjected to optical polishing at the section, and the polished section was observed for the distribution of cracks in center and periphery of each grain using an optical microscope. In both of Comparative Examples 23 and 24, cracks in each grain extended from the center to the periphery. In the image analysis for the microphotographs of the center and periphery of grain, the 50% particle diameter of silver compound particles was 2 μm in grain periphery and about 20 μm in grain center in both of Comparative Examples 23 and 24.

The critical current density Jc at 77K at 1 T was 29,800 A/cm$^2$ in Comparative Example 23 and 31,700 A/cm$^2$ in Comparative Example 24, which were both satisfactory. However, levitation force was 1 kgf in Comparative Example 23 and 2 kgf in Comparative Example 24, which were each unsatisfactory.

COMPARATIVE EXAMPLE 25

An Y$_2$O$_3$ powder, a BaCuO$_2$ powder and a CuO powder were taken in the same manner as in Examples 21–23. Thereto was added 7.7% by weight of a silver oxide powder (7% by weight in terms of silver). The mixture was mixed in a dry type pot mill and then subjected to press molding and isotropic press molding in this order in the same manner as in Examples 21–23 to obtain a columnar compact of about 46 mm in diameter and about 20 mm in height.

In the same manner as in Examples 21–23, the columnar compact was spread on a high-purity alumina plate and then kept at 1,100° C. for 1 hour in an air atmosphere to partially melt the compact.

In the same air atmosphere, the melt was cooled from 1,100° C. to 975° C. at a rate of 20° C. per hour. The subsequent procedure was the same as in Examples 21–23 to obtain a columnar YBa$_2$Cu$_3$O$_{7-x}$ superconducting composition.

The columnar superconducting composition was subjected to optical polishing at the section, and the polished section was observed for the distribution of cracks in center and periphery of each grain using an optical microscope. Some of the cracks in the center of each grain extended to the periphery of each grain. In the image analysis for the microphotographs of the center and periphery of grain, the 50% particle diameter of silver compound particles was 14 μm in grain periphery and 31 μm in grain center. The critical current density Jc at 77K at 1 T was 24,400 A/cm$^2$. Levitation force was 5 kgf.

COMPARATIVE EXAMPLES 26–28

An Y$_2$O$_3$ powder, a BaCuO$_2$ powder and a CuO powder were taken in the same manner as in Examples 21–23. Thereto were added 11% by weight of a silver oxide powder (10% by weight in terms of silver) in Comparative Example 26, 16.5% by weight of a silver oxide powder (15% by weight in terms of silver) in Comparative Example 27 and 22% by weight of a silver oxide powder (20% by weight in terms of silver) in Comparative Example 28.

Each of the mixtures obtained above was mixed in a dry type pot mill and then subjected to press molding and isotropic press molding in this order in the same manner as in Examples 21–23 to obtain three columnar compacts each of about 46 mm in diameter and about 20 mm in height.

In the same manner as in Examples 21–23, each of the columnar compacts was spread on a high-purity alumina plate and then kept at 1,100° C. for 1 hour in an air atmosphere to partially melt the compact.

In the same air atmosphere, the melt was cooled from 1,100° C. to 1,000° C. in Comparative Examples 6 and 7 and from 1,100° C. to 970° C. in Comparative Example 8, at a rate of 100° C. per hour. The subsequent procedure was the same as in Examples 21–23 to obtain three columnar YBa$_2$Cu$_3$O$_{7-x}$ superconducting compositions.

Each of the columnar superconducting compositions was subjected to optical polishing at the section, and the polished section was observed for the distribution of cracks in center and periphery of each grain using an optical microscope. In all of Comparative Examples 26–28, some of the cracks in the center of each grain extended to the periphery of each grain. In the image analysis for the microphotographs of the center and periphery of grain, the 50% particle diameter of silver compound particles was about 2 μm in grain periphery in Comparative Examples 6 and 7 and 35 μm in grain periphery in Comparative Example 8.

In all of Comparative Examples 26–28, the critical current density Jc at 77K at 1 T was about 20,000 A/cm$^2$ and the levitation force was 3 kgf, any of which was unsatisfactory.

In Examples 21–23, the 50% particle diameter of silver compound particles in grain periphery was 2–5 μm and the levitation force was far superior to those of Comparative Examples 21–28. In Comparative Examples 23–24, the 50% particle diameter of silver compound particles in grain periphery was as small as 2 μm, but the volume percentage of silver compound particles was small; presumably, this small volume percentage of silver compound particles was a reason for that the growth of cracks from grain center to grain periphery could not be prevented, resulting in unsatisfactory superconductivity.

Comparative Examples 21, 22 and 26–28 indicate that addition of silver compound in too large an amount results in larger particle diameters of silver compound particles in grain periphery and consequent inferior superconductivity. Comparison of Example 22 with Comparative Example 25 indicates that even when the amount of silver compound added is 5–12% by weight in terms of silver, the particle diameters of silver compound particles in grain periphery are large when the cooling rate in firing is small.

As is understood from the above, the growth of cracks in each grain can be prevented by making small the particle diameters of silver compound particles in the periphery of each grain, whereby significantly increased superconductivity can be obtained.

Figure 5:
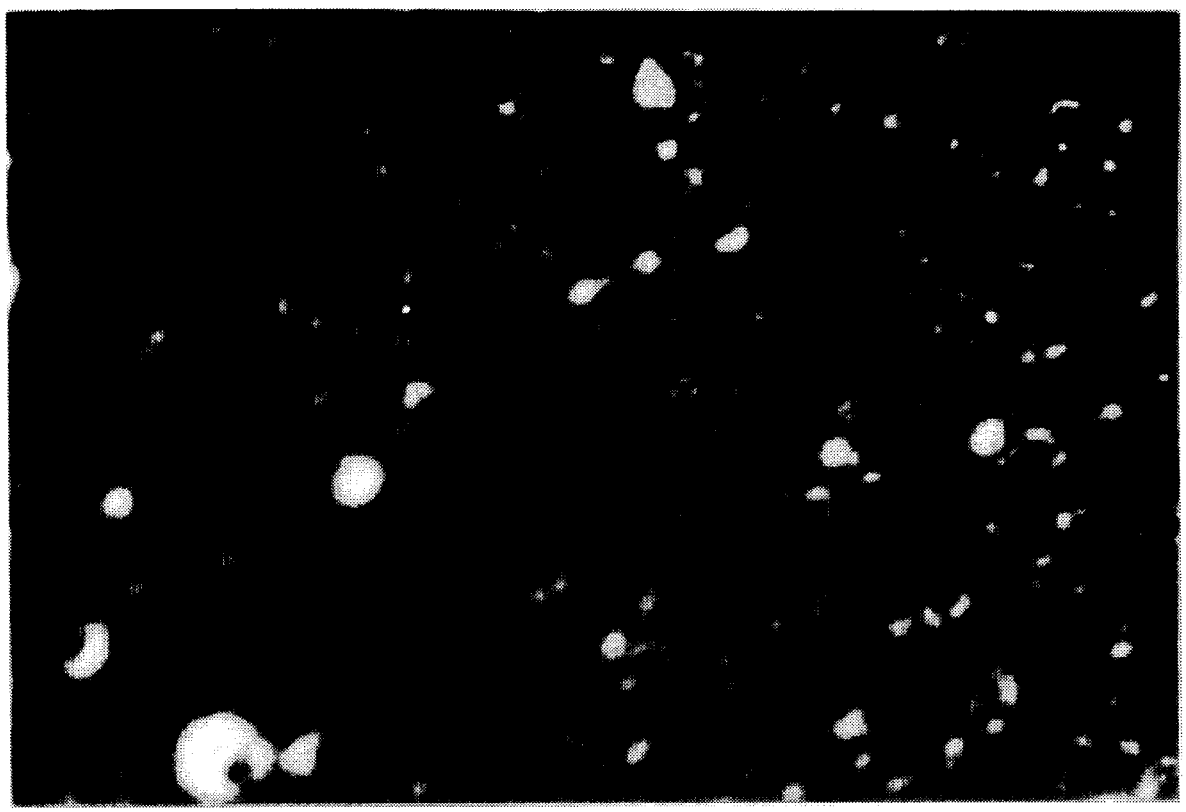
FIG. 5 is a scanning electron micrograph photograph with magnification of 200 times of a superconducting composition of the present invention including 10% by weight of silver oxide in a composition of $Y_{1.8}Ba_{2.4}Cu_{3.4}O_{7-x}$, showing a periphery of a grain.
Figure 6:
FIG. 6 is a scanning electron micrograph photograph with magnification of 200 times of the superconducting composition of FIG. 5, showing a center of the grain.

FIG. 5 and FIG. 6 are scanning electron micrograph photographs with magnification of 200 times of a superconducting composition of the present invention including 10% by weight of silver oxide in a composition of $Y_{1.8}$ $Ba_{2.4}$ $Cu_{3.4}O_{7-x}$. While FIG. 5 shows a periphery of a grain, FIG. 6 shows a center of the grain. To prepare the sample, after partial melting of a compact, the compact was cooled at a rate of 100° C. per hour to its freezing point. White dots in FIGS. 5 and 6 indicate particles containing silver. In FIG. 5 the particles having diameters of 2–5 μm are dispersed in the periphery of the grain. In FIG. 6 the particles having diameters of 10–20 μm are dispersed in the center of the grain.

Figure 7:
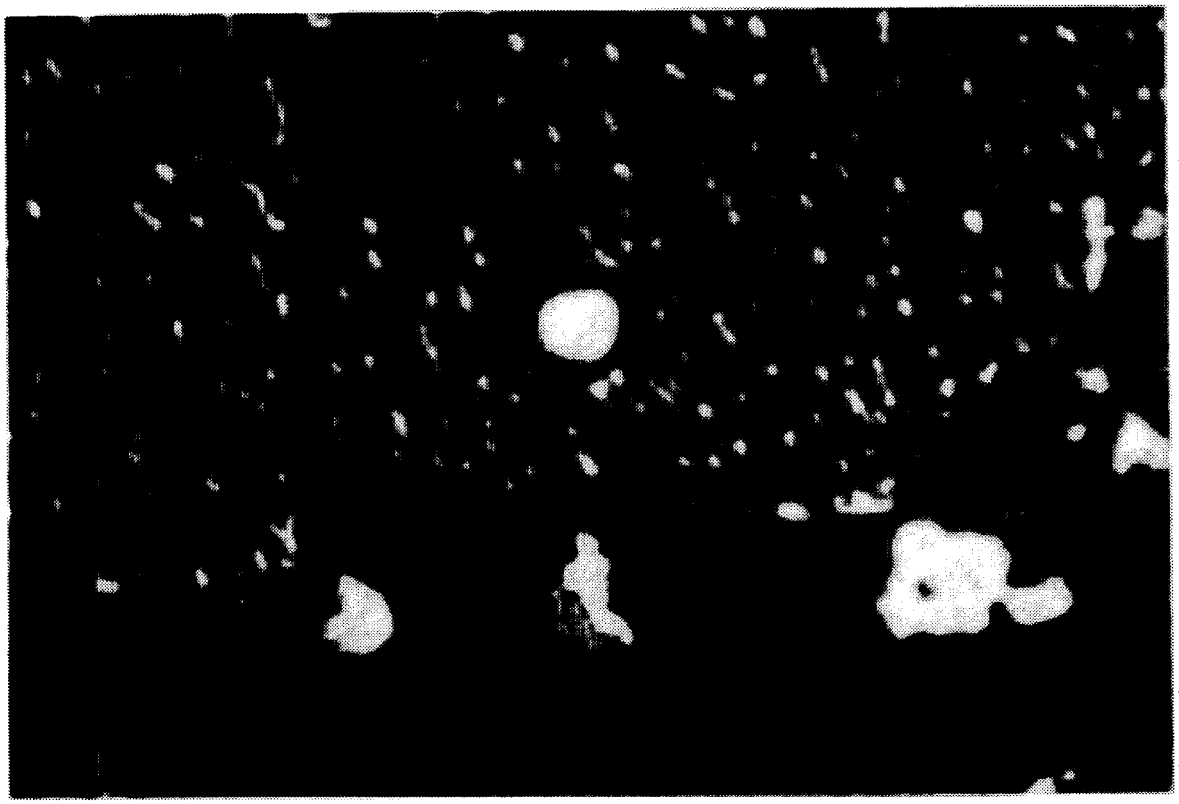
FIG. 7 is a scanning electron micrograph photograph with magnification of 200 times of a superconducting composition of the present invention including 5% by weight of metallic silver in a composition of $Y_{1.8}Ba_{2.4}Cu_{3.4}O_{7-x}$, showing a center and a periphery of a grain.

FIG. 7 is a scanning electron micrograph photograph with magnification of 200 times of a superconducting composition of the present invention including 5% by weight of metallic silver in a composition of $Y_{1.8}$ $Ba_{2.4}$ $Cu_{3.4}O_{7-x}$. To prepare the sample, after partial melting of a compact, the compact was cooled at a rate of 100° C. per hour to its freezing point. White dots in FIG. 7 indicate particles containing silver. The photograph of FIG. 7 shows a center and a periphery of a grain. Particles in the periphery have small diameters and a larger volume percentage. In contrast particles in the center have a limited diameters and larger volume percentage.

What is claimed is:

1. A copper-based rare earth superconducting composition comprising:
    at least one grain consisting essentially of a rare earth superconducting oxide; and
    a noble metal distributed throughout at least a major portion of said copper-based rare earth superconducting composition;
    wherein said composition is produced by a method comprising the steps of:
        forming at least about six layers of said superconducting composition, each layer having a constant noble metal concentration and a thickness of at least about 1.5 mm; and
        laminating and heating the layers such that (i) said composition comprises a plurality of substantially layered regions, each having a constant noble metal concentration, (ii) the concentration of noble metal in said composition as a whole increases from region to region in at least one direction in said composition, and (iii) a lowest concentration of noble metal in said composition is substantially different from a highest concentration of noble metal in said composition, said lowest concentration of noble metal differing from said highest concentration of noble metal by at least about 1 wt %.

2. A copper-based rare earth superconducting composition according to claim 1, wherein said noble metal is silver.

3. A copper-based rare earth superconducting composition according to claim 2, wherein said silver is present in an amount greater than 0 to 12% by weight of said rare earth superconducting oxide.

4. A copper-based rare earth superconducting composition according to claim 1, wherein said rare earth superconducting oxide is $REBa_2Cu_3O_{7-x}$ where RE is at least one element selected from the group consisting of Y, Gd, Dy, Ho, Er and Yb, and x ranges from 0 to 1.

5. A copper-based rare earth superconducting composition according to claim 1, wherein said noble metal is present in a plurality of particles, said particles being dispersed in each of said at least one grain.

6. A copper-based rare earth superconducting composition according to claim 5, wherein some of said particles have diameters up to about 5 μm.

7. A copper-based rare earth superconducting composition according to claim 1, wherein at least two of said layered regions have different freezing points.

8. The copper-based rare earth superconducting composition of claim 1, wherein the concentration of noble metal in each adjacent layer differs by at least about 1 wt %.

9. The copper-based rare earth superconducting composition of claim 1, wherein said lowest concentration of noble metal differs from said highest concentration of noble metal by at least about 2 wt %.

10. The copper-based rare earth superconducting composition of claim 3, wherein said silver is present in an amount greater than 1 to 12% by weight of said rare earth superconducting oxide.

11. The copper-based rare earth superconducting composition of claim 4, wherein said at least one grain comprises a plurality of fine particles dispersed therein, said particles consisting essentially of $RE_2BaCuO_5$.

12. A copper-based rare earth superconducting composition, comprising:
    a plurality of grains each consisting essentially of a rare earth superconducting oxide, each grain being similarly oriented relative to an adjacent grain; and
    a noble metal dispersed throughout at least a major portion of said copper-based rare earth superconducting composition, wherein (i) the concentration of said noble metal in said composition as a whole increases in a given direction in said composition, such that the freezing point of said composition correspondingly changes in said given direction in said composition, (ii) a dimension in said given direction is not less than about 9 mm and (iii) a lowest concentration of said noble metal in said composition is substantially different from a highest concentration of said noble metal in said composition, said lowest concentration of noble metal differing from said highest concentration of noble metal by at least about 1 wt %.

13. A copper-based rare earth superconducting composition according to claim 12, wherein said noble metal is silver.

14. A copper-based rare earth superconducting composition according to claim 13, wherein said silver is present in an amount greater than 0 to 12% by weight of said rare earth superconducting oxide.

15. A copper-based rare earth superconducting composition according to claim 12, wherein said rare earth superconducting oxide is $REBa_2Cu_3O_{7-x}$ where RE is at least one element selected from the group consisting of Y, Gd, Dy, Ho, Er and Yb, and x ranges from 0 to 1.

16. A copper-based rare earth superconducting composition according to claim 12, wherein said noble metal is present in a plurality of particles, said particles being dispersed in each of said grains.

17. A copper-based rare earth superconducting composition according to claim 16, wherein some of said particles have diameters up to about 5 μm.

18. The copper-based rare earth superconducting composition of claim 12, wherein said superconducting composition further comprises at least about six layered regions, each region having a constant noble metal concentration and a thickness of at least about 1.5 mm, and the concentration of said noble metal in said composition as a whole increases from region to region in at least one direction in said composition.

19. The copper-based rare earth superconducting composition of claim 12, wherein the concentration of noble metal in each adjacent layered region differs by at least about 1 wt %.

20. A process for making a copper-based rare earth superconducting composition including grains of a rare earth superconducting oxide and a noble metal distributed in controlled concentrations in said copper-based rare earth superconducting composition, which comprises the steps of:

(1) preparing a compact comprising a plurality of layered regions, each layered region comprising a material selected from the group consisting of a material for forming a rare earth superconducting oxide upon partial melting, a rare earth superconducting oxide, and mixtures thereof, said each layered region further containing a substantially constant concentration of a compound containing a noble metal, wherein the concentration of said noble metal in adjacent layered regions is substantially different;

(2) heating said compact to a semi-molten state; and (3) slowly cooling said compact so that grains of said rare earth superconducting oxide start growing from a layered region of said compact in which a concentration of said noble metal is lowest.

21. The process of claim 20, wherein the concentration of said noble metal in said composition as a whole increases from layered region to layered region in a given direction in said compact.

22. The process of claim 20, wherein said compound is at least one element selected from the group consisting of metallic silver and silver oxide.

23. A process for making a copper-based rare earth superconducting composition, which comprises the steps of:

(1) preparing a compact comprising a plurality of layered regions, each layered region comprising a material selected from the group consisting of a material for forming a rare earth superconducting oxide upon partial melting, a rare earth superconducting oxide, and mixtures thereof, said each layered region further containing a substantially constant concentration of a compound containing a noble metal, wherein the concentration of said noble metal in each said layered region is substantially different;

(2) contacting a surface of a seed crystal with a surface of said compact, said seed crystal having a partial melting point higher than a partial melting point of said compact, said seed crystal having a lattice constant similar to a lattice constant of said rare earth superconducting oxide;

(3) heating said compact and said seed crystal so that said compact becomes semi-molten while said seed crystal remains in contact therewith; and (4) slowly cooling said compact and said seed crystal so that grains of said rare earth superconducting oxide start growing in said compact from said surface thereof in contact with said seed crystal.

24. The process of claim 23, wherein a concentration of said noble metal in a first layered region of said compact which contacts said seed crystal is the lowest concentration of said noble metal in said compact, and the concentration of said noble metal in said compact increases from layered region to layered region in a direction away from said first layered region.

25. The process of claim 20, wherein the lowest concentration of noble metal in the compact differs from the highest concentration of noble metal in the compact by at least about 1 wt %.

26. The process of claim 20, wherein said plurality of layered regions is at least six.

27. The process of claim 20, wherein each layered region has a thickness of at least about 1.5 mm.

28. The process of claim 20, wherein said rare earth superconducting oxide is $REBa_2Cu_3O_{7-x}$ where RE is at least one element selected from the group consisting of Y, Gd, Dy, Ho, Er and Yb, and x ranges from 0 to 1.

29. The process of claim 20, wherein the concentration of noble metal in each adjacent layered region differs by at least about 1 wt %.

30. The process of claim 22, wherein said compound is silver and is present in an amount greater than 0 to 12% by weight of said rare earth superconducting oxide.

31. The process of claim 22, wherein said compound is silver and is present in an amount greater than 1 to 12% by weight of said rare earth superconducting oxide.

32. The process of claim 23, wherein the lowest concentration of noble metal in the compact differs from the highest concentration of noble metal in the compact by at least about 1 wt %.

33. The process of claim 23, wherein said plurality of layered regions is at least six.

34. The process of claim 23, wherein each layered region has a thickness of at least about 1.5 mm.

35. The process of claim 23, wherein said rare earth superconducting oxide is $REBa_2Cu_3O_{7-x}$ where RE is at least one element selected from the group consisting of Y, Gd, Dy, Ho, Er and Yb, and x ranges from 0 to 1.

36. The process of claim 23, wherein the concentration of noble metal in each adjacent layered region differs by at least about 1 wt %.

37. The process of claim 23, wherein said compound is at least one element selected from the group consisting of metallic silver and silver oxide.

38. The process of claim 23, wherein said compound is silver and is present in an amount greater than 0 to 12% by weight of said rare earth superconducting oxide.

39. The process of claim 23, wherein said compound is silver and is present in an amount greater than 1 to 12% by weight of said rare earth superconducting oxide.

40. The copper-based rare earth superconducting composition of claim 12, wherein said lowest concentration of noble metal differs from said highest concentration of noble metal by at least about 2 wt %.

41. The copper-based rare earth superconducting composition of claim 14, wherein said silver is present in an amount greater than 1 to 12% by weight of said rare earth superconducting oxide.

42. The copper-based rare earth superconducting composition of claim 15, wherein said at least one grain comprises a plurality of fine particles dispersed therein, said particles consisting essentially of $RE_2BaCuO_5$.

* * * * *